(12) United States Patent
Gailus et al.

(10) Patent No.: US 8,968,026 B2
(45) Date of Patent: Mar. 3, 2015

(54) HIGH SPEED NETWORK INTERFACE

(75) Inventors: Mark W. Gailus, Concord, MA (US); Stephen W. Ellsworth, San Diego, CA (US); Prescott B. Atkinson, Nottingham, NH (US)

(73) Assignee: Amphenol Corporation, Wallingford Center, CT (US)

( * ) Notice: Subject to any disclaimer, the term of this patent is extended or adjusted under 35 U.S.C. 154(b) by 435 days.

(21) Appl. No.: 13/342,929

(22) Filed: Jan. 3, 2012

(65) Prior Publication Data

US 2012/0176756 A1 Jul. 12, 2012

Related U.S. Application Data

(60) Provisional application No. 61/429,387, filed on Jan. 3, 2011.

(51) Int. Cl.
| | |
|---|---|
| *H01R 24/00* | (2011.01) |
| *H01R 13/66* | (2006.01) |
| *H01R 24/64* | (2011.01) |
| *H01R 107/00* | (2006.01) |
| *H05K 1/02* | (2006.01) |

(52) U.S. Cl.
CPC ............ *H01R 13/6633* (2013.01); *H01R 24/64* (2013.01); *H01R 2107/00* (2013.01); *H05K 1/0243* (2013.01); *H05K 2201/09163* (2013.01); *H05K 2201/10189* (2013.01); *H05K 2201/10446* (2013.01)
USPC ............. 439/620.07; 439/620.05; 439/620.17

(58) Field of Classification Search
USPC ............. 439/620.05, 620.07, 620.11, 620.17
See application file for complete search history.

(56) References Cited

U.S. PATENT DOCUMENTS

| | | | | |
|---|---|---|---|---|
| 3,477,009 | A | * 11/1969 | Nichols | ......................... 320/163 |
| 5,113,159 | A | 5/1992 | Adriaenssens et al. | |
| 5,157,531 | A | 10/1992 | Foglia | |
| 5,587,884 | A | * 12/1996 | Raman | ........................... 361/728 |
| 5,640,314 | A | * 6/1997 | Glasband et al. | ............... 363/36 |
| 5,647,767 | A | * 7/1997 | Scheer et al. | ............. 439/620.17 |
| 5,736,910 | A | 4/1998 | Townsend et al. | |

(Continued)

OTHER PUBLICATIONS

"Magnetic Modular Jacks," 2012, http://www.molex.com/molex/products/family?key=magnetic_modular_jacks&channel=PRODUCTS&chanName=family&pageTitle=Introduction, downloaded Apr. 16, 2012, 1 page.

(Continued)

*Primary Examiner* — Truc Nguyen
(74) *Attorney, Agent, or Firm* — Wolf, Greenfield & Sacks, P.C.

(57) ABSTRACT

A network interface adapted for high speed networks. The interface includes isolation circuits with a transformer containing two primary coils and two secondary coils. A wire making up each primary coil may be twisted with a wire making up a secondary. These two coils may then be co-wound on a common core. The transformer may be connected to a common mode choke. The isolation circuit may be packaged such that the transformer and coil are in a line, with isolation circuits for a plurality of pairs arranged in parallel. The interface circuit may be packaged in a connector housing, which also may be adapted for high speed performance. The housing may receive multiple isolation circuits in parallel. The housing may also include a mating contact portion in which mating contacts for signal conductors of each pair are positioned along the same side of a cavity.

31 Claims, 22 Drawing Sheets

(56) References Cited

U.S. PATENT DOCUMENTS

| | | | |
|---|---|---|---|
| 5,759,067 A * | 6/1998 | Scheer | 439/607.26 |
| 5,825,259 A | 10/1998 | Harpham | |
| 5,872,492 A | 2/1999 | Boutros | |
| 5,892,667 A * | 4/1999 | Glasband et al. | 363/36 |
| 5,971,813 A * | 10/1999 | Kunz et al. | 439/676 |
| 6,116,946 A | 9/2000 | Lewis et al. | |
| 6,116,963 A * | 9/2000 | Shutter | 439/676 |
| 6,840,817 B2 | 1/2005 | Chen | |
| 7,123,117 B2 | 10/2006 | Chen et al. | |
| 7,153,163 B2 * | 12/2006 | Lewis et al. | 439/620.11 |
| 7,445,507 B1 | 11/2008 | Parker | |
| 7,701,092 B1 | 4/2010 | Parker et al. | |
| 7,786,009 B2 | 8/2010 | Machado et al. | |
| 8,591,261 B2 * | 11/2013 | Das et al. | 439/620.05 |

OTHER PUBLICATIONS

International Search Report for PCT/US2012/020113 dated Jan. 3, 2012.

N. Grossner, "The Wide-Band Transformer Synthesis", *Transformers for Electronic Circuits*, McGraw Hill, pp. 221 and 222, 1967.

* cited by examiner

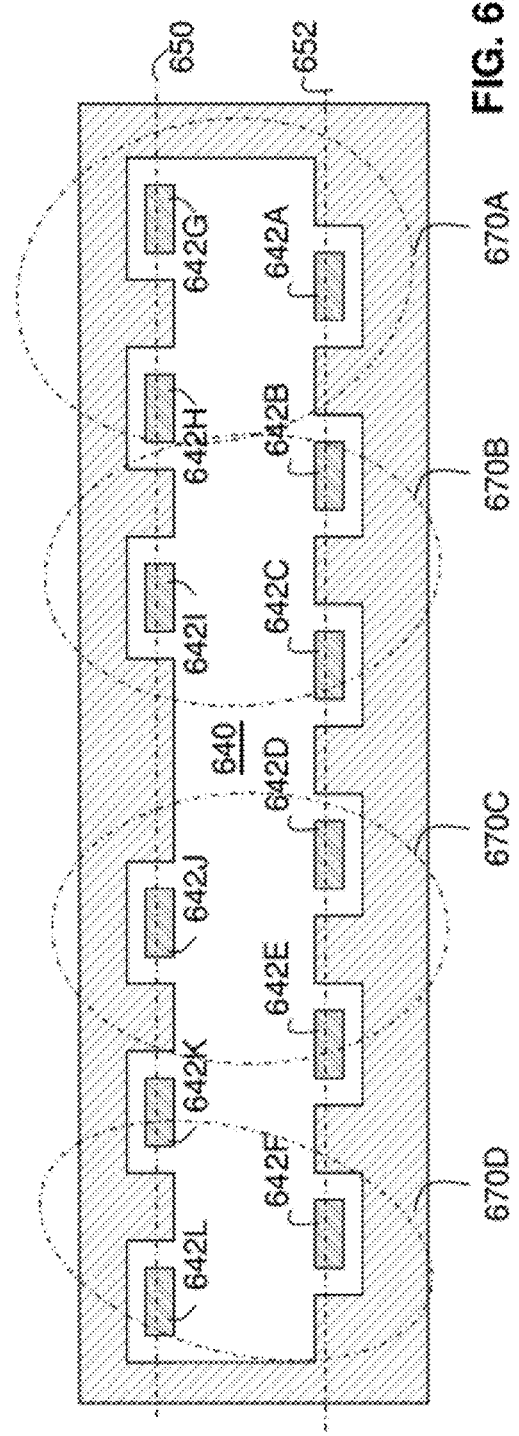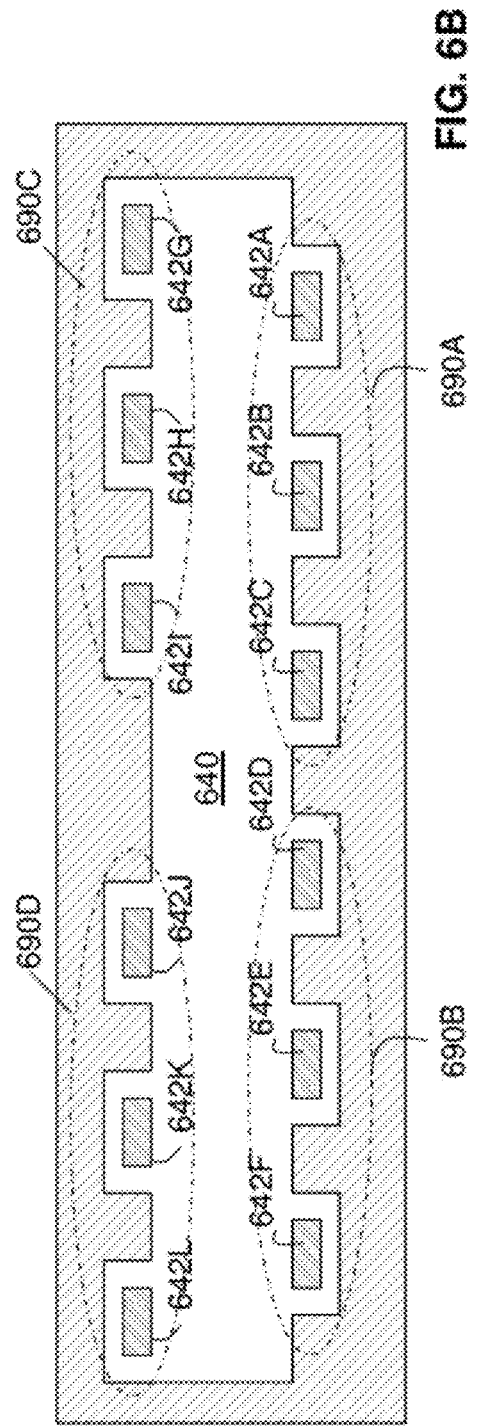

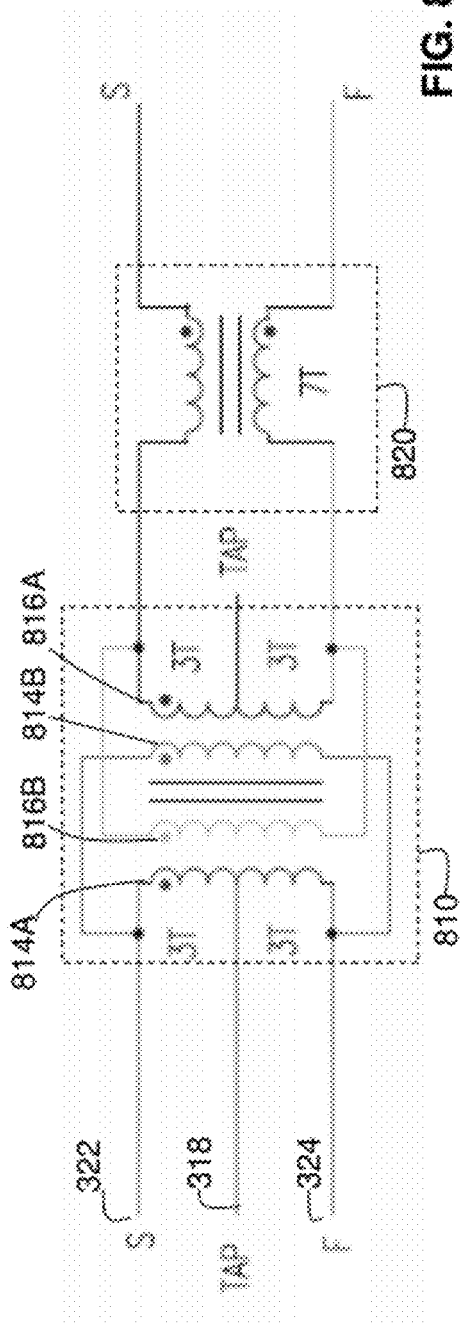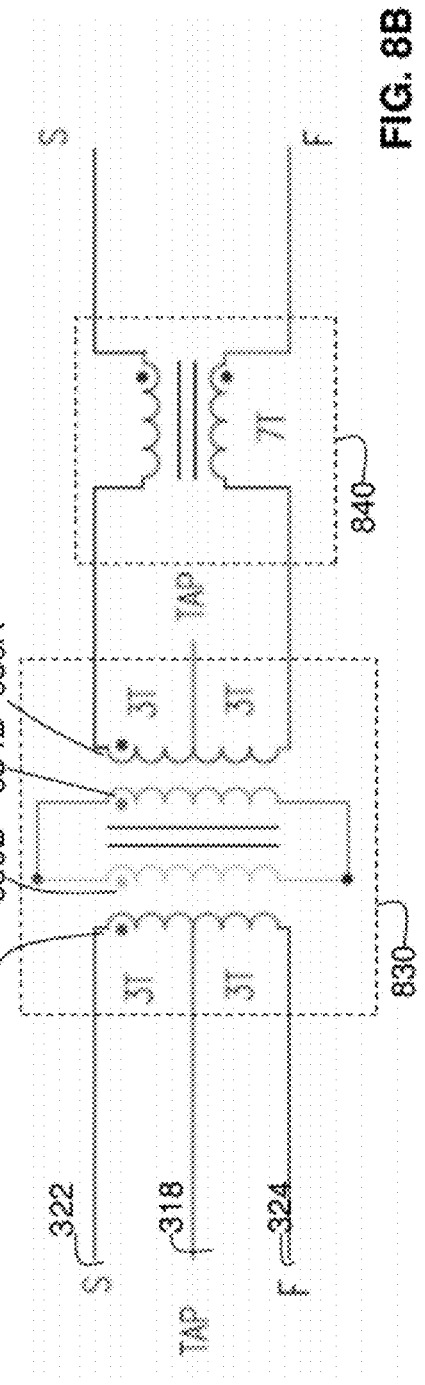

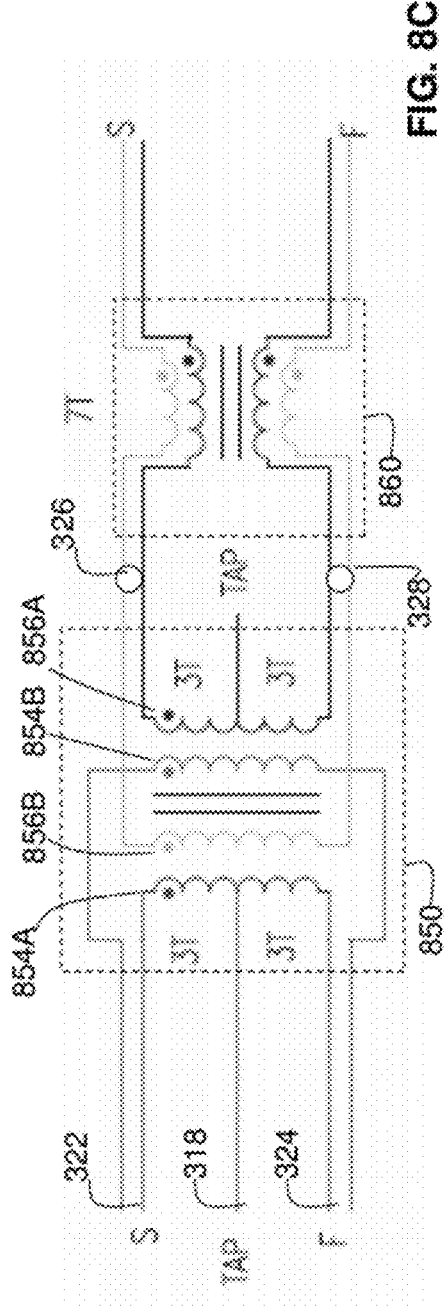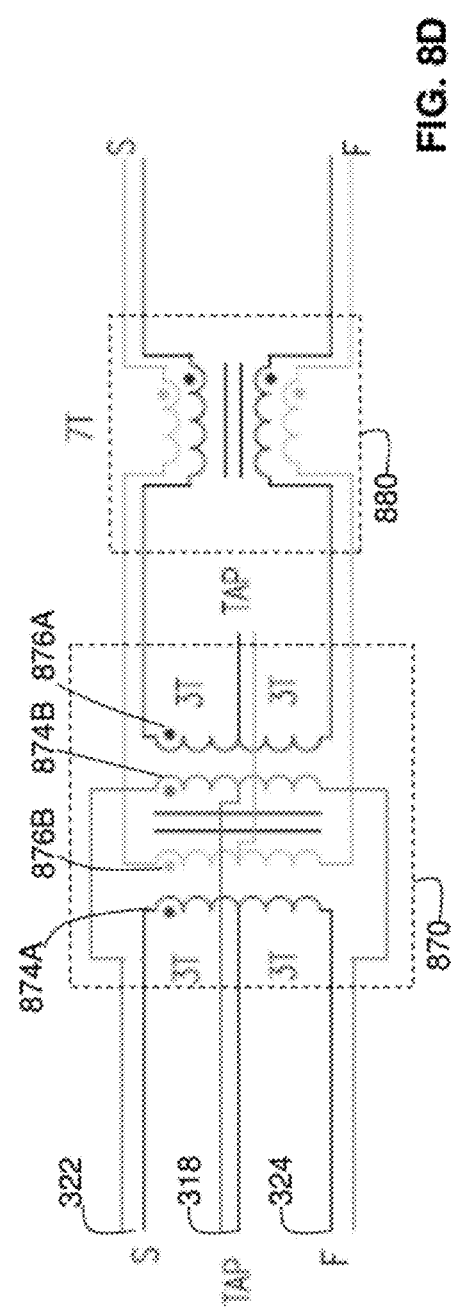

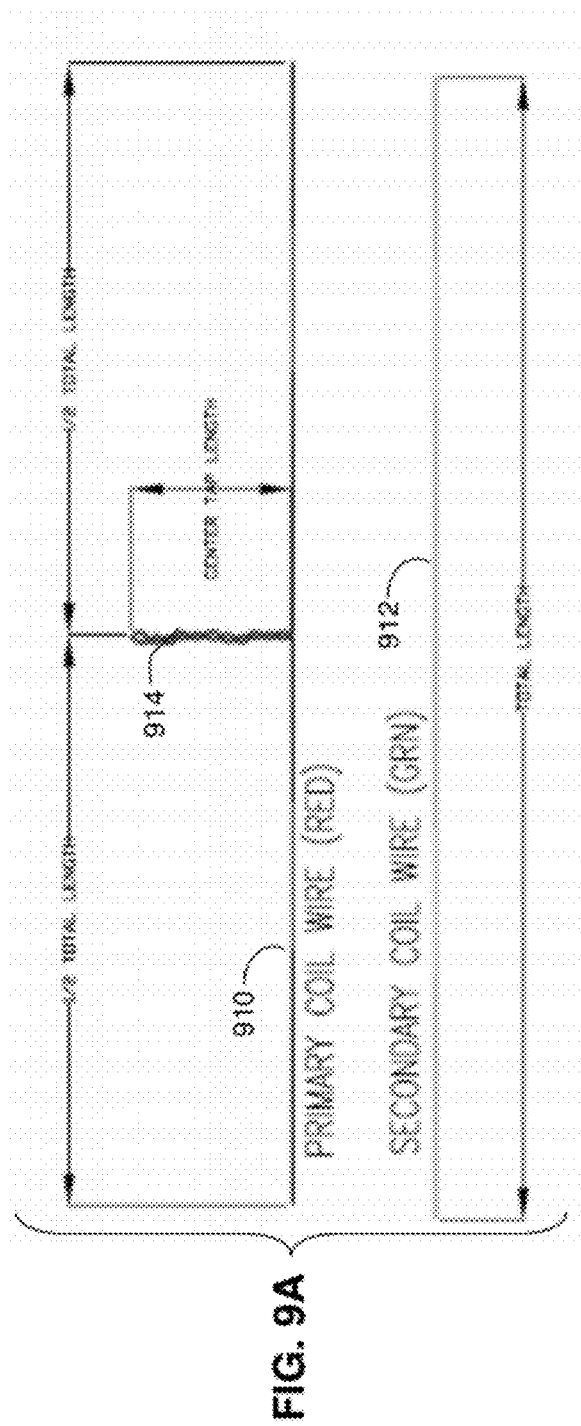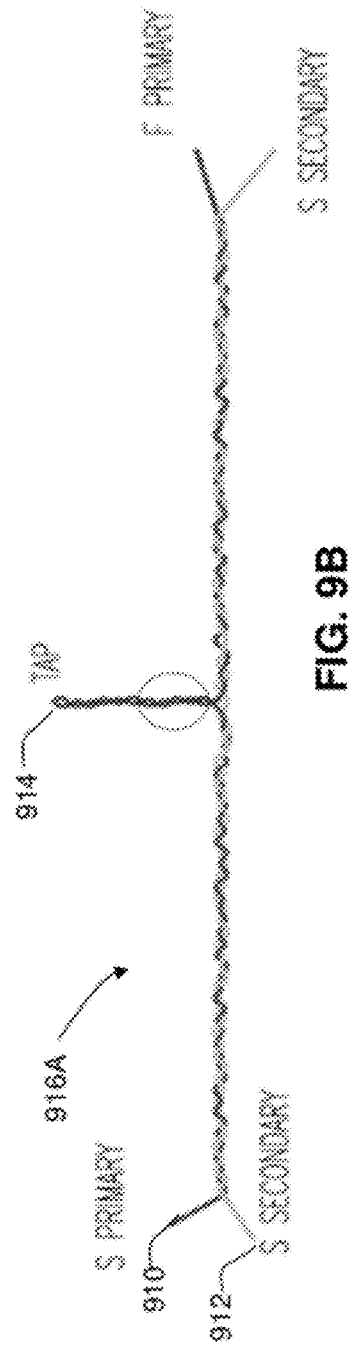
FIG. 9A
FIG. 9B

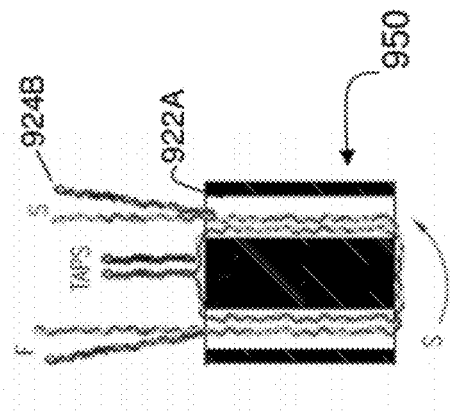
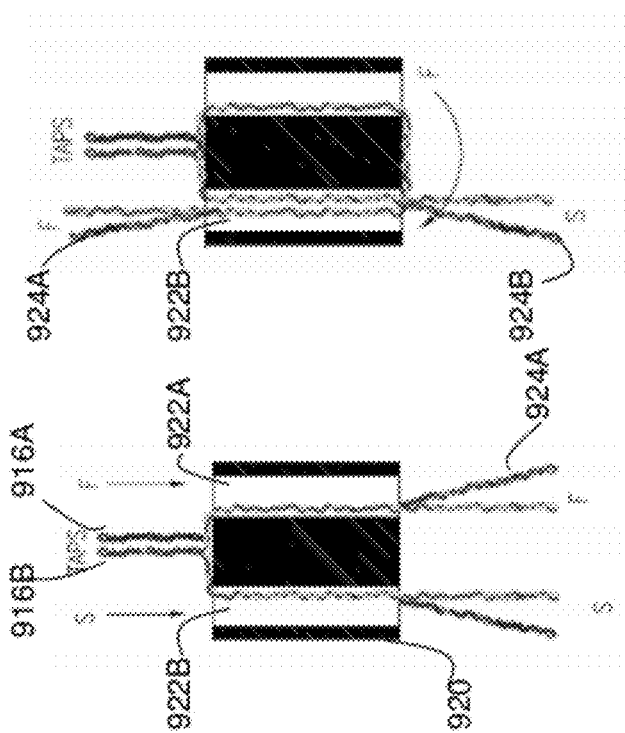
FIG. 9E
FIG. 9D
FIG. 9C

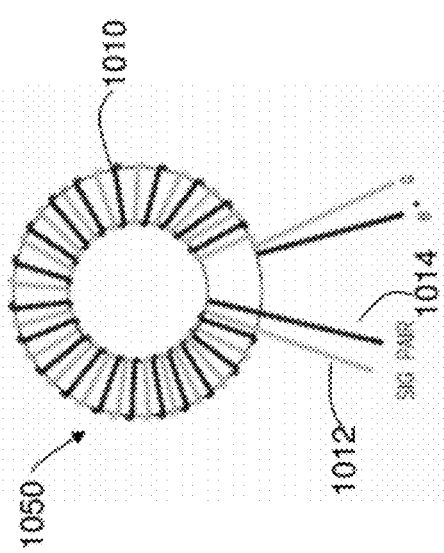
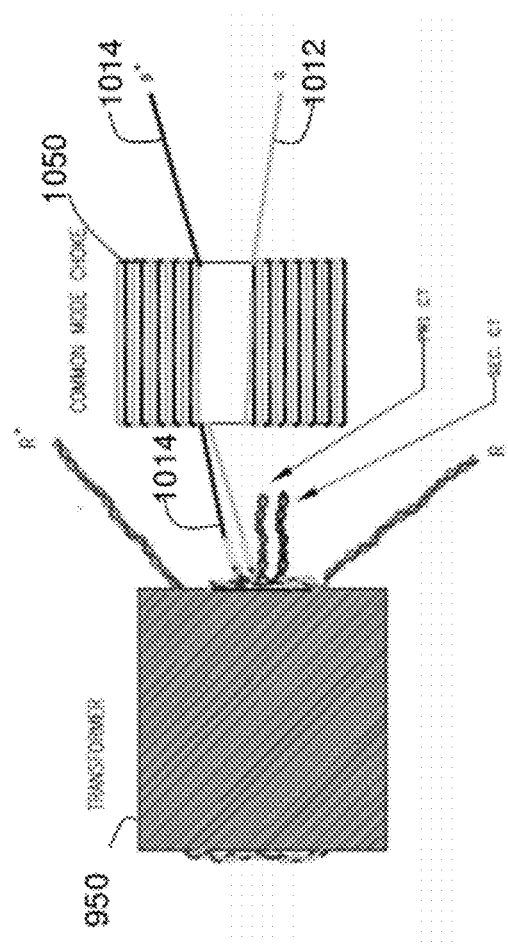

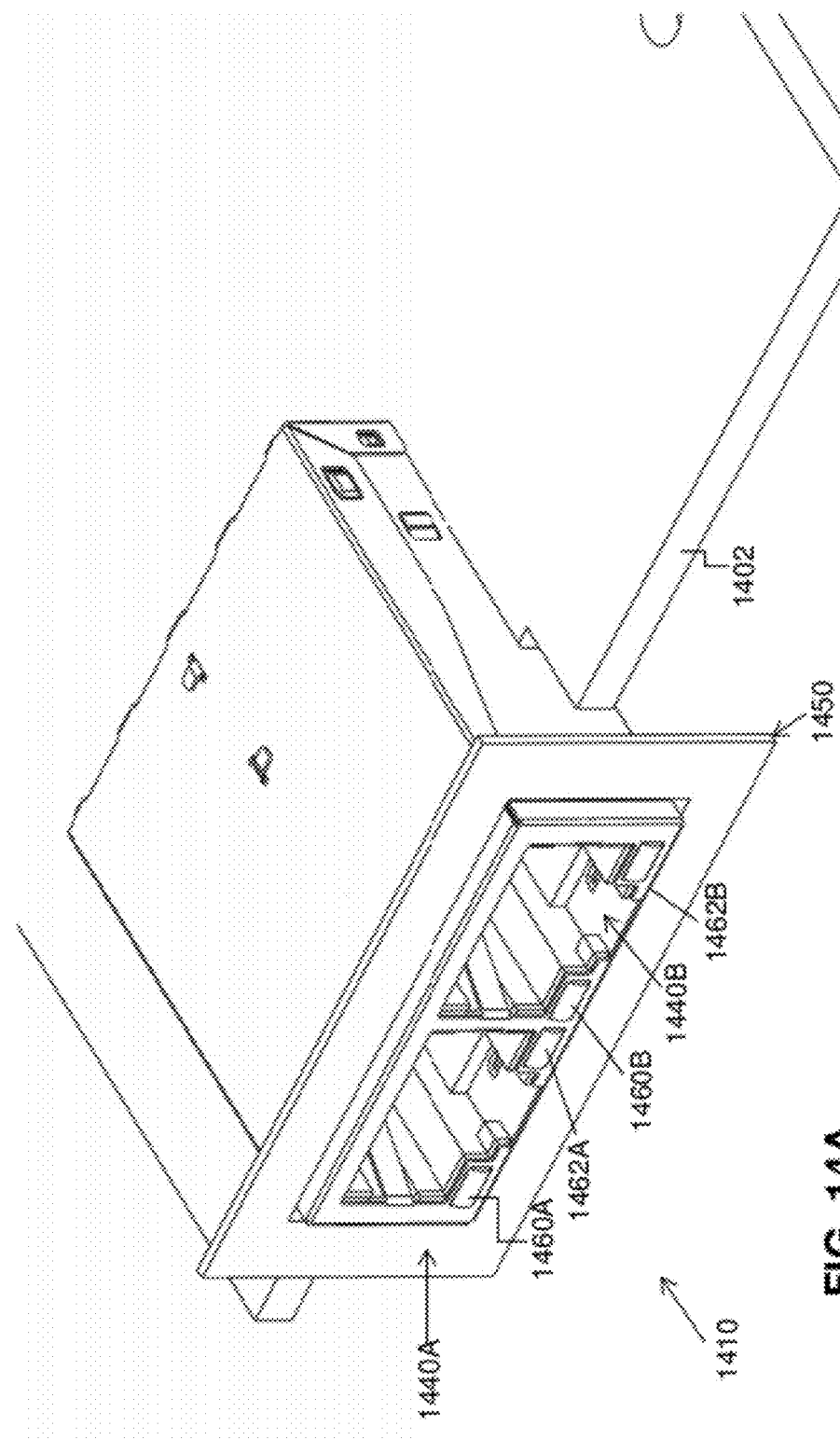

HIGH SPEED NETWORK INTERFACE

CROSS-REFERENCE TO RELATED APPLICATIONS

This application claims priority to U.S. Provisional Application No. 61/429,387 filed Jan. 3, 2011 which is incorporated herein by reference.

FIELD OF THE INVENTION

This invention relates generally to electrical connectors and more specifically to electrical connectors adapted to allow electronic devices to be coupled to a data network.

RELATED TECHNOLOGY

Electronic systems are frequently constructed as multiple separate devices that are then interconnected in a desired configuration. In some configurations, an electronic system may contain multiple computing devices, each connected to a network, that conveys data between the devices. The network itself may also contain separate devices, such as routers and switches, that facilitate the flow of data over the network.

To facilitate interconnections of devices through a network, many computing devices have a network interface. The network interface may includes a connector into which a connection medium, used to carry signals over the network, can be readily connected to the device. The connector may be mounted on an exterior surface of the device, allowing the connection medium, such as a cable, to be easily connected to the device. Such a connector is sometimes referred to as a "jack." When a network cable is connected to the jack, the device then may send and receive data over the network through.

Within the computing device, a transceiver is coupled to the connector. Other components generate and provide to the transceiver data to be transmitted over the network. Components inside the device also receive from the transceiver and process data received over the network. For transmission, the transceiver formats data as electrical signals suitable for transmission over the network. For received information, the transceiver converts electrical signals received over the network into data in a format suitable for processing by components internal to the computing device.

The format of the electrical signals on the network may be prescribed by a standard such that computing devices using different network interfaces, possibly manufactured at different times by different parties, can effectively communicate. The standards in use at any time may reflect communication needs of computer users. One such standard is called "10G BASE-T" or "IEEE 802.3an-2006" or "10G Ethernet." Network connections according to this standard are intended to provide 10 gigabit/second connections over unshielded or shielded twisted pair cables, over distances up to 100 meters (330 ft). According to this standard, 4 twisted pairs are used for signal transmission, each pair nominally carrying data at a rate of up to 2.5 Gb/s. Each pair is a signal path, and data is encoded on the pair using 16 voltage level Pulse Amplitude Modulation (PAM-16) encoding, which is essentially equivalent to 4 bits at a time, which effectively lowers the bandwidth requirement of a communication path carrying such signals. Nonetheless, that path should carry signals up to about 300 MHz with very little distortion, and signals up to about 500 or 600 MHz without any highly erratic behavior.

One measure of the quality of a communication path, or any portion of the path, may be the "S Parameters" as a function of frequency. S parameters may be measured with a test tool called a network analyzer. These parameters are derived by modeling a transmission path as a multi-port device. One end of the path may be regarded as one port and the other end of the path may be regarded as the second port. Each of the parameters represents the ratio of signal power applied at one of the ports to a response at another port. These ratios are frequently expressed using a scale, known as the decibel (dB) scale, in which a ratio of less than 1 appears as a negative number. For example, the S parameter S11 indicates the ratio of power reflected back at port 1 to power incident on port 1 when all other ports are terminated in a reference impedance, typically 50 ohms. Another of the S parameters is S21, which represents the ratio of power that passes to port 2 to power input to port 1.

The S parameters S11 (sometimes called "return loss") and S21 (sometimes called "scattering parameter" or "insertion loss") may provide a good indication of the performance of a transmission path used for a network connection. S11 desirably should be low and S21 desirably should be high over the frequency range of signals formatted according to the network protocol.

Many communications standards specify that signals conveyed on the network are formatted as time-varying differential signals. For conveying such signals, it is known to electrically isolate the connection medium from the electronic components inside the electronic device. Such isolation may be achieved with an isolation circuit that includes a transformer. The transformer passes time-varying signals, but blocks the flow of DC current. The isolation circuit may also include a common mode choke. A common mode choke tends to equalize signal levels on the legs forming a differential pair, which can improve electrical performance of the assembly.

SUMMARY

An electronic assembly that provides improved high frequency performance, and is particularly suited for use in providing an interface to a network using a 10G BASE-T standard. The assembly includes an electrical connector with at least four pairs of conductive elements that are suitable for carrying four differential signals.

The assembly also includes a plurality of circuits. Each of the circuits may include at least a transformer coupled to one of the pairs of conductive elements. The transformers may have a first winding and a second winding. Either or both of the windings may be formed with at least two wires wound around a common core. In some embodiments, each of the wires of the first winding may be twisted together with a wire of the second winding. These pairs of twisted wires may then be wound around a common core.

In some embodiments, the circuits are integrated into a housing of the connector. Such a connector may be further integrated into a larger assembly, such as a computing device. Though, in some embodiments, the circuits may be separately packaged and mounted to a substrate, such as a printed circuit board within the computing device.

In some embodiments, each circuit may additionally include a common mode choke. The common mode choke in each of the circuits may be aligned with a respective transformer. When the circuits are integrated in a housing of an electrical connector, the housing may be adapted to accommodate generally parallel paths through the respective circuits. Adaptations to support such a configuration may include relieved portions of the housing to accommodate the plurality of circuits in parallel. Such adaptations may also include a wall within the housing that receives a connection mechanism suitable for attachment of a conductor serving as a center tap. The wall may be positioned between a cavity that holds transformers and a cavity that holds chokes such that a connection to ground may be made within the connector with relatively little additional wire.

Other features to provide desired performance may also be incorporated into the connector. In some embodiments, the conductive elements within the connector have mating contact portions that are disposed in two columns along two sides of a cavity, such as in a conventional RJ-45 jack. However, in contrast to a conventional contact arrangement, every pair of conductive elements is formed by two mating contacts on the same side of the cavity. Each pair may additionally be associated with a third mating contact. That third contact may be positioned on a side of the cavity opposite the pair.

Accordingly, in some aspects, the invention relates to an electronic assembly, which may be a connector assembly, an electronic component or assembly of other form. Such an electronic assembly may include a jack comprising a plurality of conductive elements, the plurality of conductive elements being arranged in a plurality of pairs. Each of the plurality of transformers may be associated with a respective pair of the plurality of pairs. Each of the transformers may have a first winding comprising at least two wires wound in parallel. The wires of the first winding may each have a first end and a second end, with the first end being electrically coupled to a first conductive element of the respective pair and the second end being electrically coupled to a second conductive element of the respective pair. The transformer may also have a second winding comprising at least two wires wound in parallel.

In other aspects, the invention may relate to an electronic assembly comprising that includes a connector comprising a plurality of conductive elements. The assembly may also include a plurality of circuits, each circuit being coupled to a respective set of conductive elements of the plurality of conductive elements. Each of the plurality of circuits may comprise a transformer comprising a plurality of primary windings and a plurality of secondary windings and a choke connected in series with the transformer.

In yet a further aspect, the invention may relate to a method of operating an electronic assembly. The method may include generating a plurality of 10G Ethernet signals, and coupling, through a circuit, each of the plurality of 10G Ethernet signals to a conductive element of a connector comprising a plurality of conductive elements. Each of the circuits may include a transformer comprising a plurality of primary windings and a plurality of secondary windings and a choke connected in series with the transformer.

In yet a further aspect, the invention may relate to an electronic assembly. The electronic assembly may include a connector comprising a plurality of conductive elements arranged in a plurality of pairs. The assembly may also include a plurality of transformers, each of the plurality of transformers may associated with a respective pair of the plurality of pairs. Each of the transformers may include a core with a first and second windings. The first winding may include at least two wires wound in parallel. The at least two wires of the first winding may each have a first end and a second end, the first end being electrically coupled to a first conductive element of the respective pair and the second end being electrically coupled to a second conductive element of the respective pair. The second winding may have at least two wires wound in parallel. A first of the at least two wires of the first winding is twisted together with a first of the at least two wires of the second winding.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 8A, 8B, 8C and 8D are each a schematic illustration of an alternative embodiment of an isolation circuit;

FIGS. 9A, 9B, 9C, 9D and 9E are sketches illustrating successive steps in a method of manufacturing a transformer according to some embodiments of the invention;

FIG. 10 is a sketch of a common mode choke at a step in the manufacture of an isolation circuit according to some embodiments of the invention;

FIG. 11 is a sketch of a circuit combining a transformer manufactured according to the process of FIGS. 9A . . . 9E and a common mode choke as in FIG. 10;

DETAILED DESCRIPTION

Applicants have recognized and appreciated that performance of high speed data networks can be improved through changes in the construction of isolation circuits used in network interfaces. Such improvements may be used separately or in combination and may be integrated in a jack or may be used in a separate isolation circuit.

Figure 1:
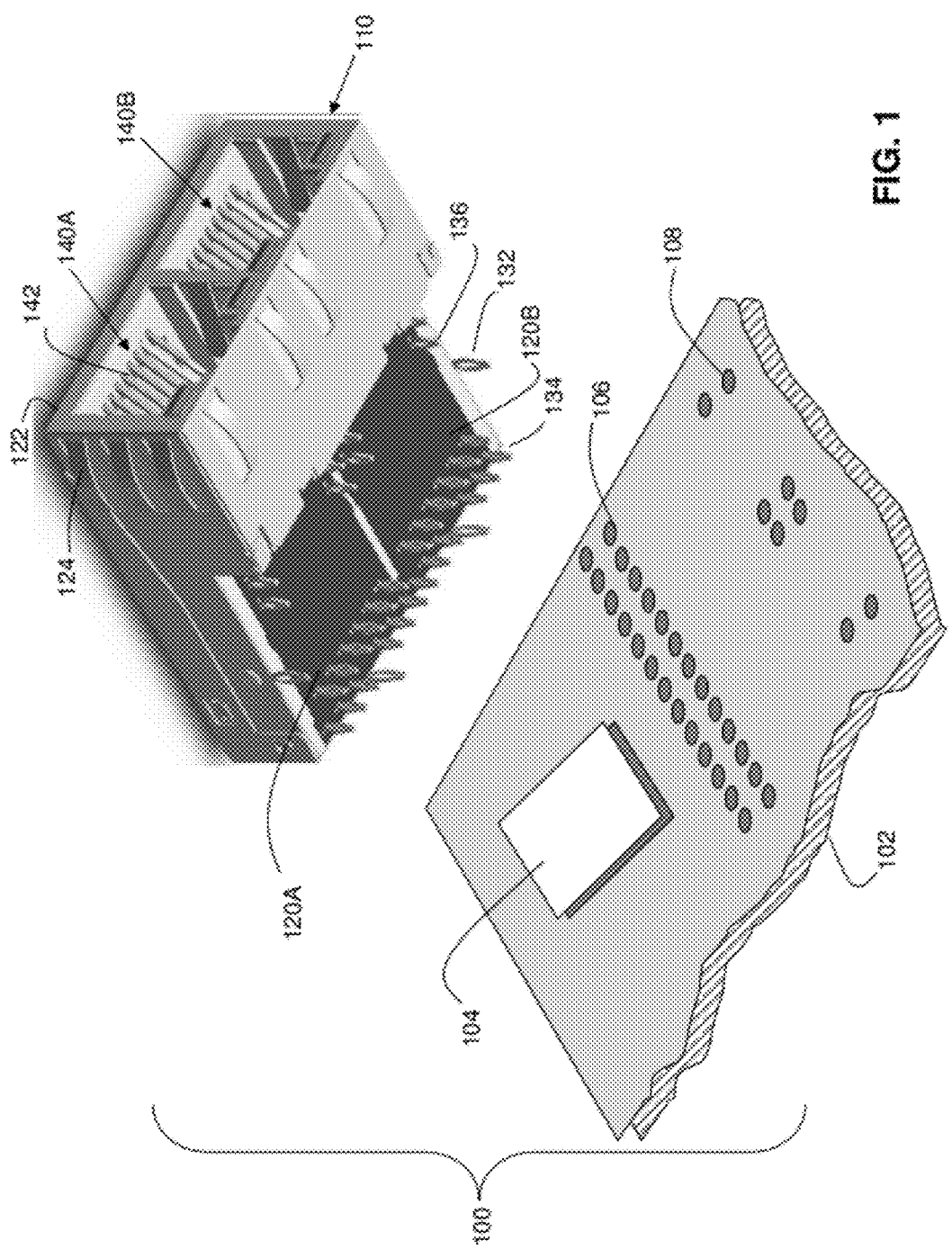
FIG. 1 is a partially exploded view of a printed circuit board implementing a network for use in an electronic device.

FIG. 1 illustrates an electronic assembly that may provide an interface to a high speed data network, such as a network operating according to the "10GBASE-T," or IEEE 802.3an-2006 standard. In this example, network interface 100 may include a substrate, such as printed circuit board (PCB) 102, and may be constructed using techniques as are known in the art for constructing network interface cards as may be conventionally found in electronic devices.

One or more electronic components may be attached to PCB 102. Here, an electronic component 104 is illustrated. Component 104, for example, may be a 10G Ethernet transceiver as is known in the art for generating and processing high speed signals for communication over a network. Though a single component is illustrated, it should be appreciated that a single component is pictured for simplicity. In some embodiments, multiple components may be present.

A connector assembly 110 may also be attached to PCB 102. Connector assembly 110, in some embodiments, may be connected to component 104 through traces in PCB 102 such that connector assembly 110 may couple signals to and from component 104 and a network. Here, connector assembly 110 contains two identical connectors, connectors 120A and 120B. However, it is not a requirement that all of the connectors in connector assembly 110 be identical. Also, though two connectors are illustrated, it should be appreciated that any suitable number of connectors may be present in network interface 100.

As shown, the connectors 120A and 120B are enclosed within a structure, here illustrated as cage 122. Cage 122 may be a component of a connector assembly as is known in the art. Here, cage 122 is a conductive enclosure, surrounding the mating interfaces of connectors 120A and 120B to block electromagnetic energy radiating from conductive elements within connector assembly 110 from interfering with other electronic components and to block electromagnetic energy from external sources from reaching conductive elements within connector assembly 110, and interfering with signals passing through connector assembly 110. Cage 122 has a forward portion with fingers 124 that may be inserted into a opening in a wall of an enclosure for an electronic device such that connectors 120A and 1120B can be accessed from external to the electronic assembly. Cage 122 may alternatively or additionally provide support to multiple connectors within connector assembly 110.

Regardless of the number and type of connectors in connector assembly 110, in some embodiments, each connector may have a mating interface shaped to receive a mating connector (not pictured). Accordingly, each of connectors 120A and 120B is illustrated as a receptacle-type connector. In this example, connectors 120A and 120B have a mating interface that is configured according to a standard, implementing an RJ-45 jack.

Such a connector may receive a mating connector configured as a plug designed according to the RJ-45. Though, the specific format of the mating connector is not critical to the invention, and each of the connectors 120A and 120B may be configured to receive a mating connector of any suitable type.

In addition to being configured for mating with a connector 120A or 120B, the mating connector may be configured for attachment to a connection medium of the type used for carrying electrical signals over a network. For example, the mating connector may be attached to a network cable, allowing a device containing network interface 100 to be connected to a network.

As shown, each of the connectors 120A and 120B has a mating interface portion. In the example of FIG. 1, the mating interface portion of each of the connectors includes a cavity 140A or 140B, respectively. Each of the cavities is sized to receive a mating connector. Portions of conductive elements within connector assembly 110 are exposed within the cavity, creating mating contacts, of which mating contact 142 is numbered. When a mating connector is inserted into a cavity, conductive elements within the mating connector make electrical connection with mating contacts, such as mating contact 142, completing an connection from a conductive element in the connection medium to a conductive element within connector assembly 110.

In use, network interface 100 may be a portion of an electronic system, such as a computer or server. Electronic components within that system may generate data for transmission over a network. That data may pass through signal terminals of the electronic components and then pass as electrical signals through traces (not shown) on PCB 102. Components, such as component 104, may process or otherwise condition those signals for transmission over a network accessible through a connector 120A or 120B. The electrical signals may then pass to connector assembly 110 where those signals are coupled onto the connection medium used to implement the network. Signals received over the network may be processed in reverse, flowing through connector assembly 110, through PCB 102 to other components within the electronic system contain network interface 100.

In the embodiment illustrated, PCB 102 contains vias to allow electrical connections to be made between traces internal to PCB 102 and conductive elements within connector assembly 110. Tails of the conductive elements within connector assembly 110 may extend from the connector assembly such that each may make electrical connection to a via, thereby completing a conductive path. In the example of FIG. 1, that electrical connection is made through the use of press-fit tails. Both an electrical and mechanical connection may be formed by pressing a press-fit tail into a via. Though, it should be appreciated that any suitable connection technique may alternatively or additionally be used.

As illustrated, press fit tail 132 is representative of a tail extending from cage 122. In the illustrated embodiment, tails extending from cage 122 are inserted into vias that are coupled to ground planes (not shown) within PCB 102. In this way, the cage 122 is grounded, increasing its effectiveness at blocking electromagnetic radiation.

Tail 134 is an example of a press-fit tail extending from an end of a conductive element within connector assembly 110. In the embodiment illustrated, each of the mating contacts 142 is formed on one end of a conductive element within connector assembly 110. A contact tail, such as press-fit tail 132 is formed at an opposite end of a conductive element. The mating contact and the tail may be connected through an isolation circuit, as described in greater below.

Other contact tails may be provided to make connections to other conducting structures within connector assembly 110. Corresponding connection structures may be provided on PCB 102. For example, contact tails, of which contact tail 136 is representative, may be included to make other connections, such as to LEDs mounted in connector assembly 110 to serve as network status indicators. Vias 108 may be provided on PCB 102 to connect tails 136 to conductive structures within PCB 102 that couple tails, such as tail 136, to electronic components within an electronic device to process signals as appropriate.

In the illustrated embodiment, the contact tails such as tails 134, and the conductive elements passing through connector assembly 110 to which they connect, are positioned in groups of three. Though grouping in threes is not critical to the invention, such positioning may facilitate the propagation of differential signals. Each group of three may carry two legs of a differential pair and an associated reference signal, which may be termed a "ground." In the embodiment illustrated, each of the connectors 120A and 120B is configured to carry four differential pairs, each configured for carrying a high speed, differential signal representing digital data. Accordingly, there are a total of twelve contact tails, such as contact tails 134, per connector illustrated in FIG. 1. Though, it should be appreciated that the specific number of pairs of signals supported by each connector is not critical to the invention.

Regardless of the number differential signals supported by a connector, in some embodiments, network interface 100 may include an isolation circuit for each differential signal. As is known in the art, the isolation circuit may allow time-varying signals to pass while blocking DC levels. Each such isolation circuit may include a transformer and, in some embodiments may also include a common mode choke.

The isolation circuits may be packaged as part of network interface 102 in any suitable way. In some embodiments, the isolation circuits may be packaged as a separated component and attached to PCB 102. For example, component 104 may represent a component containing isolation circuits for each of the differential signals passing through connector assembly 110. In other embodiments, the isolation circuits may be integrated into connector assembly 110. For example, each of the connectors 120A and 120B may contain an isolation circuit for each pair of conductive elements configured for carrying a differential signal that it contains. As a specific example, each of connectors 120A and 120B may contain four isolation circuits, one for each of the pairs of conductive elements passing from a contact tail, such as tail 134 to a mating contact, such as mating contact 142.

Figure 2:
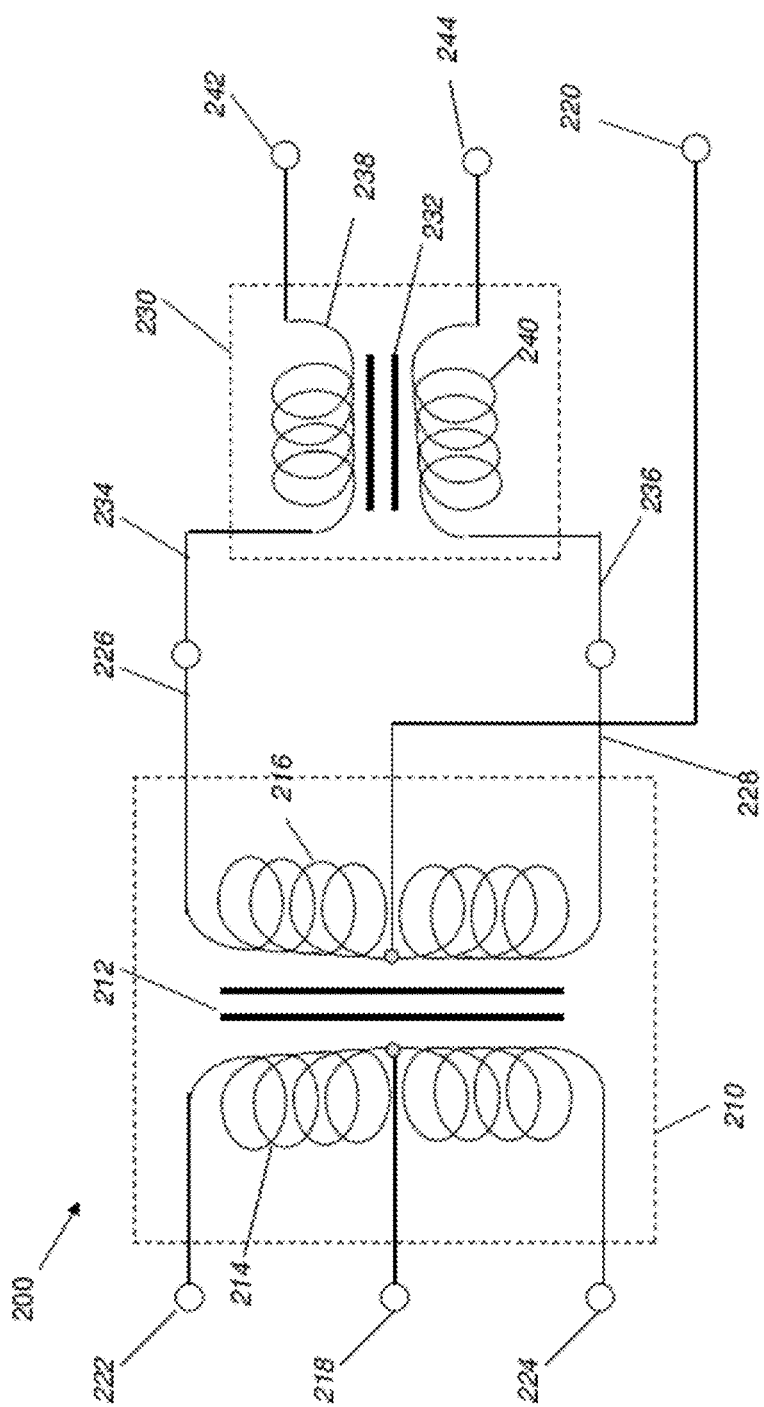
FIG. 2 is a schematic diagram of a conventional isolation circuit in a network interface.

Regardless of the packaging used for the isolation circuit, the isolation circuit may be constructed using techniques as are known in the art. FIG. 2 schematically illustrates a conventional isolation circuit.

In FIG. 2, isolation circuit 200 is shown to contain a transformer 210 and a common mode choke 230 connected in series. Transformer 210 has a primary winding 214 and a secondary winding 216. Both primary winding 214 and secondary winding 216 may be formed from wires wound around core 212.

As used herein, a "wire" refers to an elongated conductor. The wires may be formed of any suitable flexible conductive material. Wires may be formed from a single or multiple strands of metal enclosed within an insulative sheath, for example. Though, wires may be formed in other ways, such as by patterning a trace on a substrate.

Core 212 is made of a material with a high magnetic permeability, such as a ferrite. Core 212 may be a binocular core. Such a core may be generally oblong with two holes, spaced to leave a central member between the holes. The wires forming the windings pass through the holes and are wrapped around the central member.

In this configuration, the high magnetic permeability of the core ensures that a large portion of the magnetic flux generated by an alternating current in the primary 214 passes through the secondary winding 216, which creates coupling of alternating signals from the primary to the secondary winding. The coupling may be increased by twisting wires forming the primary 214 and the secondary 216 together before wrapping them around the core.

Alternatively, a core of any suitable shape that accommodates both windings may be used. As an example of one alternative, the core may be a torroid.

In circuit 200, transformer 210 is connected in series with common mode choke 230. Accordingly, ends 226 and 228 of secondary winding 216 are shown coupled to ends 234 and 236 of windings 238 and 240, respectively.

When connected as part of a network interface, one of the primary 214 or secondary 216 windings is connected to a printed circuit board, such as PCB 102 (FIG. 1). The other of the windings is coupled, in this case through common mode choke 230, to a connector, such as a connector 120A or 120B. For example, ends 242 and 244 of windings 238 and 240 of common mode choke 230 may be connected to a printed circuit board.

Ends 242 and 244 may serve as a signal port through which a differential signal can be coupled. Ends 222 and 224 may similarly serve as a port. Which of the ports is coupled to a connector and which his coupled to a transceiver of a network interface is not critical to the invention. Accordingly, either the port formed by ends 242 and 244 or ends 222 and 224 may be connected through PCB 102 to components that generate and/or process data to be transmitted or received over a network. The other of the ports may be connected to mating contacts within a connector such that signals passing through isolation circuit 200 will be coupled between components that generate or process data for transmission and a cable or other connection medium that forms a portion of a network. With this configuration, signals blocked by isolation circuit 200 are not transmitted or, if received over the network, are not processed.

Each of the primary 214 and secondary 216 is shown as a center-tapped winding. The center tap 218 of primary 214 may serve as a "ground" conductor. The center tap 220 of secondary 216 may be connected to ground.

While isolation circuit 200 may be adequate for many network connections, the inventors have recognized and appreciated that the performance of a high speed network interface may be improved through improved design and construction of isolation circuit 200. One or more improvements in the circuit configuration and implementation may be used, either alone or in combination, to provide a network interface that provides better insertion loss and/or better return loss characteristics.

Figure 3:
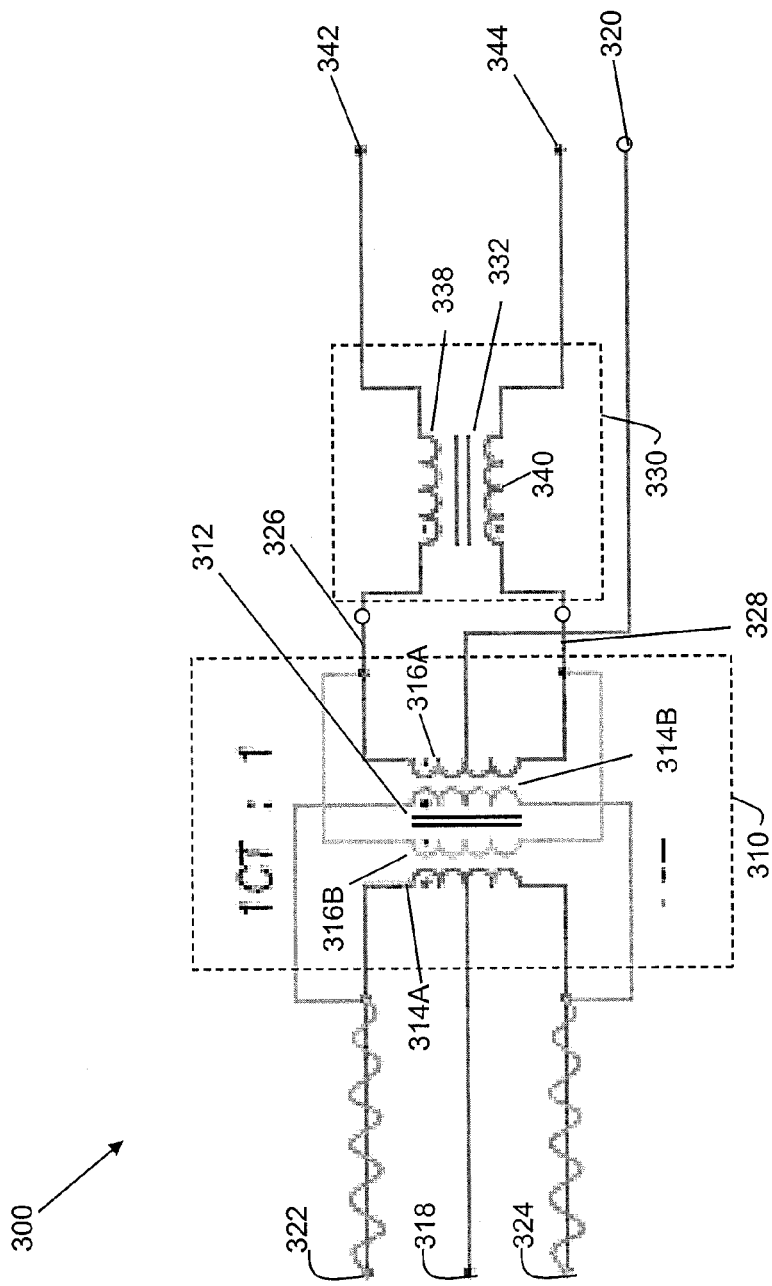
FIG. 3 is a schematic diagram of an isolation circuit in a network interface according to some embodiments of the invention.

FIG. 3 illustrates an isolation circuit 300 using design techniques to provide better insertion loss and/or better return loss characteristics. Here isolation circuit 300 includes a transformer 310 and a common mode choke 330. Transformer 310 and common mode choke 330 may serve the same functions as transformer 210 and common mode choke 230 (FIG. 2) and may be manufactured using similar techniques and materials. Accordingly, ends 322 and 324 may be connected to mating contacts of conductive elements within a connector acting as signal conductors for a differential signal. End 318 may be connected to a mating contact of a conductive element within the connector acting as ground conductor. Ends 342 and 344 may be connected to traces within a printed circuit board carrying a differential signal to components that generate or process the signal. End 320 may be connected to a corresponding structure within the printed circuit board acting as a ground.

Though, one of skill in the will appreciate that the specific end of isolation circuit 300 coupled to mating contacts of a connector or coupled to a transceiver of a network interface is not critical to the invention. Accordingly, in some embodiments, ends 242 and 244 may be coupled to conductive elements within a connector providing mating contacts to engage corresponding conductive elements in a plug or other type of connector. Conversely, ends 322 and 324 may be coupled to a transceiver forming a portion of the network interface. In that scenario, end 318 may be coupled to a reference conductor acting as a ground shared with the transceiver.

In an embodiment in which isolation circuit 300 is integrated into a connector, ends 342 and 344 may be connected to conductive elements within the connector that include the mating contacts for the connector. Ends 322 and 324 may be coupled to conductive elements within the connector having contact tails designed to engage a printed circuit board to which the connector is attached. End 318 may similarly be coupled to a contact tail designated for a ground conductor. End 320 may be coupled, through conductive structures within the connector, to the ground reference established by the connection of end 318 to a ground or in any other suitable way.

Isolation circuit 300 differs from isolation circuit 200 in that, rather than contain a single primary and a single secondary winding, transformer 310 contains multiple primary and secondary windings. In the example of FIG. 3, two primary windings 314A and 314B are shown. Two secondary windings 316A and 316B are shown. The primary windings are wound in parallel such that end 322 is the common end of the two wires that make up primary windings 314A and 314B. Similarly, end 324 is formed as the other end of the two wires that make up primary windings 314A and 314B. In this example, FIG. 3 illustrates that the wires making up primary 314A and 314B are twisted together adjacent ends 322 and 324. Though, within the transformer 310, the wire making up primary 314A is twisted together with the wire making up secondary 316B. Similarly, the wire making up primary 314B is twisted together with the wire making up secondary 316A.

Transformer 310, like transformer 210, may be a 1:1 center tapped transformer. In the embodiment illustrated, only one of the multiple primary windings and only one of the multiple secondary windings has a center tap. Accordingly, FIG. 3 shows that end 318 is coupled to a center tap of primary winding 314A and end 320 is coupled to a center tap of secondary winding 316A. Though, in other embodiments, more than one winding may have a center tap.

The number of turns around core 312 in transformer 310 is not critical to the invention. In some embodiments, the number of turns for each primary winding 314A and 314B may be the same as the number turns as in primary 214 (FIG. 2). Consequently, the impedance presented by transformer 310 may be approximately half that of transformer 210. For example, in some embodiments 4 turns may be used. In other embodiments, 6 turns may be used. Though, any suitable number, such as 2, 3, 5 or 7 turns may be used and the impedance of transformer 310 may be more or less than that of a transformer in a conventional isolation circuit by adjusting the number of turns, wire gauge or other construction parameters.

As shown, transformer 310 may be connected in series to common mode choke 330. Accordingly, ends 326 and 328 are shown connected to windings 338 and 340, respectively, of common mode choke 330. Here, end 326 is the connection of two wires, one making up secondary winding 316A and the other making up secondary winding 316B. Common mode choke 330 may otherwise be manufactured similar to common mode choke 230, with windings 338 and 340 around a core 332.

Figure 4:
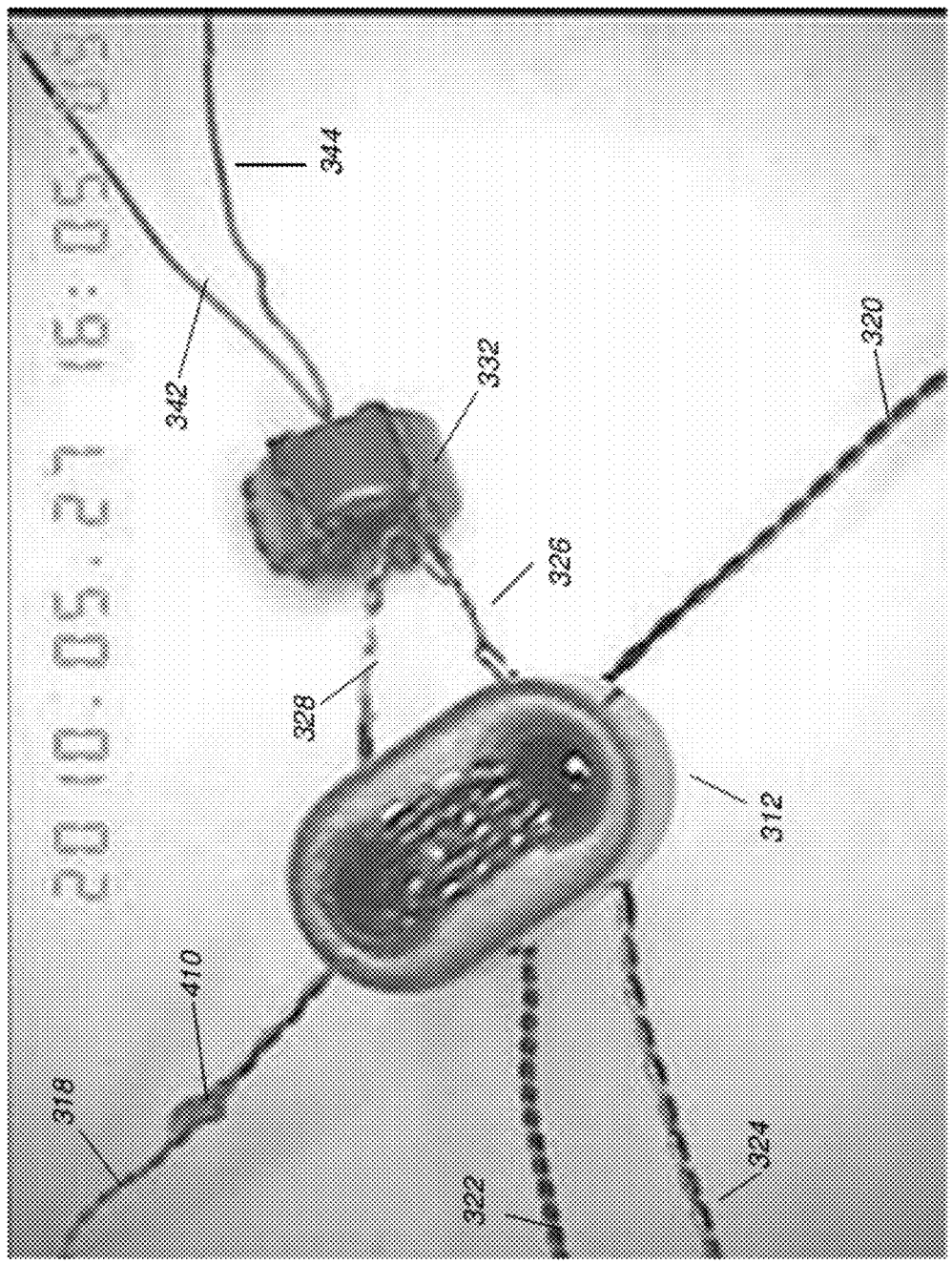
FIG. 4 is a sketch of an implementation of the isolation circuit of FIG. 3.

FIG. 4 is a sketch of components used to construct isolation circuit 300. In this example, core 312 is a binocular core. Core 332 is a torroid.

In the example of FIG. 4, wires used to form common mode choke 330 are coupled to wires used to form secondary windings 316A and 316B. Accordingly, there may be no abrupt termination to the wires. Rather, the ends 326 and 328 of the wires may be any location on the wire where a connection is made. In this example, a connection between transformer 310 and common mode choke 330 is made by soldering. However, there is no requirement that there be an identifiable coupling mechanism. For example, in some embodiments, a continuous wire may be used to form one or more of windings 316A or 316B and one or more of windings 338 or 340. In such an embodiment, an end of the wire forming windings 316A and 316B may be any point identified as a transition between transformer 310 and common mode choke 330.

FIG. 4 also reveals a solder bead 410 attached to the wires serving as a center tap of the transformer 1. Solder bead 410 may be applied in any suitable way, such as by using a soldering iron to burn insulation off the wires forming the center tap to expose the wires. A mass of molten solder may then be applied to the exposed wires to form solder bead 410.

Regardless of the techniques used to form the isolation circuit of FIG. 4, the components may be packaged for use in a network interface. The isolation circuit of FIG. 4 may be packaged so that it can be connected in a signal path between electronic components in an electronic assembly that generate or receive network signals and a connection medium carrying network signals. For networks that involve multiple signal paths, multiple isolation circuits may be packaged together, one for each signal.

Figure 5:
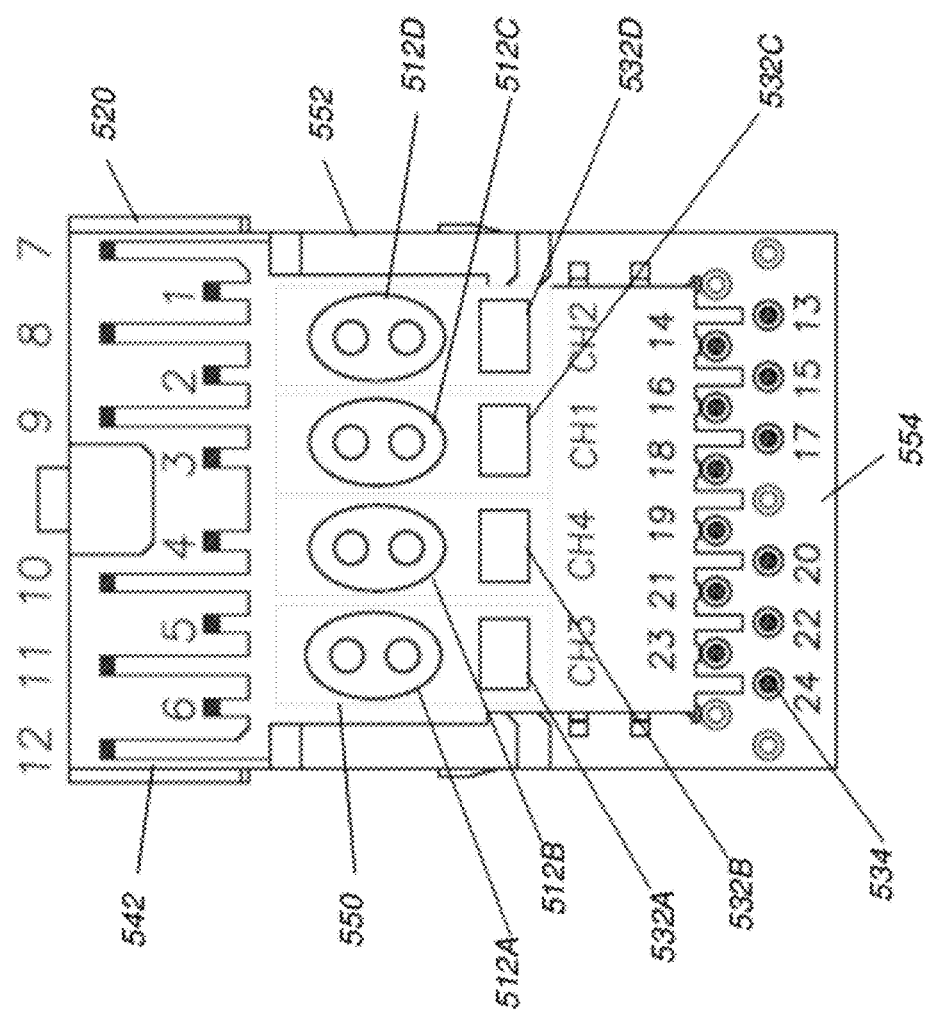
FIG. 5 is a schematic illustration of electrical connections through a connector according to some embodiments of the invention.

The interface circuit or circuits may be packaged in any suitable component, including in a separate component mounted to a printed circuit board, such as PCB 102 (FIG. 1) or a connector, such as connector 120A or 120B (FIG. 1). FIG. 5 illustrates a connector adapted to receive four isolation circuits. Such a configuration may be used, for example, in connection with 10G Ethernet, which specifies four channels that operate in parallel to provide an aggregate data rate of 10 Gbps. A signal path for each such channel may include an isolation circuit.

FIG. 5 shows the cores of the transformers and common mode chokes of four isolation circuits, configured to provide isolation in four channels of an connector having exterior dimensions in accordance with an RJ-45 jack standard. Though, it should be appreciated that any suitable number of isolation circuits may be packaged together in packaging of any suitable configuration.

The isolation circuits may be integrated into the connector in any suitable way. In this example, an insultative housing 552 is formed with a cavity 550 sized to receive the isolation circuits. In this example, connector assembly 520 has a lower surface 554 adapted to be mounted adjacent a printed circuit board, and cavity 550 is formed in lower surface 554. It should be appreciated, however, that the orientation of the connector relative to the printed circuit board is not critical to the invention and the isolation circuits may be positioned in a cavity formed in a surface facing away from a printed circuit board or at any other suitable location within or associated with the connector housing. Though interior dimensions of connector assembly 520 are modified by formation of cavity 550, the exterior dimensions of housing 522 may be in accordance with the RJ-45 standard, or other suitable standard, such that connector assembly 520 may be interchangeable with a connector manufactured according to that standard that is not constructed according to techniques described herein for improved performance in a high speed network interface.

In FIG. 5, cores 512A . . . 512D, representing cores of transformers in each of four channels, are shown positioned within cavity 550. Cores 532A . . . 532D are also shown, representing cores of common mode chokes in each of the four channels. Wires wound around these cores, and connections between the wires of the transformers and the wires of the common mode chokes, are not expressly shown. However, such wires may be as illustrated in FIG. 4 or may be implemented in any other suitable way.

Connections between the isolation circuits and other portions of the signal paths making up each of the channels also are not expressly shown. However, FIG. 5 illustrates that connector assembly 520 includes mating contacts, of which mating contact 542 is numbered, and tails, of which tail 534 is numbered. The mating contacts may be positioned to mate with respective mating contacts in a mating connector when that mating connector is mated with connector assembly 520. The tails may be positioned to connect to attachment points on a printed circuit board, such as vias 106 (FIG. 1).

Conductive elements that form mating contacts, such as mating contact 542, and tails, such as tail 534, may be formed and integrated into connector assembly 520 in any suitable way, including using techniques as are known in the art. As an example, the conductive elements may be stamped from sheets of metal and inserted into passages formed in housing 522 sized to receive them. In other embodiments, the conductive elements may be stamped and then housing 522 may be molded around them using an insert molding operation. As yet a further example, the conductive elements may be formed in subsets that can each be affixed to a separate housing portion. The housing portion, including the subsets of the conductive elements, may be secured together in any suitable way to form housing 522.

Regardless of how the conductive elements are incorporated into housing 552, the isolation circuits may be electrically connected to these conductive elements. Any suitable connection mechanism may be used. For example, wires as illustrated in FIG. 4 may be soldered to posts (such as posts 1560a ... 1560d, FIG. 15) or other suitable structures formed as part of the conductive elements. Though, it should be appreciated that any mechanism that provides a suitable mechanical and electrical connection may be used. For example, insulation displacement contact points or other structures that make contact to a wire without use of solder may alternatively or additionally be used.

As a further example of a suitable connection mechanism, one or more printed circuit boards may be integrated into the connector assembly. Multiple ground conductors, for example, may be attached to a ground plane within a printed circuit board, providing a common ground reference for all of the circuits in the connector. Alternatively or additionally, a printed circuit board may contain one or more layers of traces, each adapted to carry a signal. Accordingly, one or more printed circuit boards within the connector may provide a mechanism for interconnecting mechanically separate conductive elements forming portions of a single signal path.

Regardless of the interconnection mechanism, the isolation circuits, when connected to the conductive elements within connector assembly 520, may complete signal paths between the contact tails and the mating contacts. When connector assembly 520 is used in a network interface in which the tails, such as tail 534, are coupled to components that generate and receive network signals and mating contacts, such as mating contact 542, mate with mating contacts of a connector attached to a network connection medium, an isolation circuit is connected in the signal path of each of the channels.

In one example, each isolation circuit may be connected to three contact tails and three mating contacts. For example, for each isolation circuit, wires containing ends 318, 322 and 324 each may be connected to mating contact associated with a single channel. Similarly, wires containing ends 320, 342 and 344 may be connected to contact tails associated with the same channel. In the example of FIG. 5, the mating contacts are numbered to show positions 1 ... 12. The contact tails are number to show positions 13 ... 24. This numbering may correspond to positions defined for a connector standard, such as RJ-45 12 pin connector, in this example. However, a novel channel assignment to these positions may be used to provide improved high speed performance.

In the example illustrated, positions 13 and 15 correspond to contact tails associated with a differential signal path in a channel, designated as Channel 2, in the example of FIG. 5. Positions 7 and 8 may correspond to mating contacts for the same differential signal path. Position 14 may correspond with a contact tail for a ground connection associated with the same channel, and position 1 may correspond with a mating contact for that ground connection.

Positions 16 and 18 correspond to contact tails associated with a differential signal path in a channel, designated as Channel 1, in the example of FIG. 5. Positions 2 and 3 may correspond to mating contacts for the same differential signal path. Position 17 may correspond with a contact tail for a ground connection associated with the same channel, and position 9 may correspond with a mating contact for that ground connection.

Positions 19 and 21 correspond to contact tails associated with a differential signal path in a channel, designated as Channel 4, in the example of FIG. 5. Positions 4 and 5 may correspond to mating contacts for the same differential signal path. Position 20 may correspond with a contact tail for a ground connection associated with the same channel, and position 10 may correspond with a mating contact for that ground connection.

Positions 22 and 24 correspond to contact tails associated with a differential signal path in a channel, designated as Channel 3, in the example of FIG. 5. Positions 11 and 12 may correspond to mating contacts for the same differential signal path. Position 23 may correspond with a contact tail for a ground connection associated with the same channel, and position 6 may correspond with a mating contact for that ground connection.

With such an assignment of positions, the signal paths for each channel are substantially of the same length as they pass through connector assembly 520. Such a configuration may be achieved in part by selection of the positions used for each channel. Such a configuration may also be achieved through the positioning of the components in each isolation circuit. As can be seen in FIG. 5, cores 512A ... 512D are positioned in parallel in a column across cavity 550. Similarly, cores 532A ... 532D are positioned in parallel in a column. The column with cores 512A ... 512D is parallel to the column with cores 532A ... 532D. Additionally, the cores are positioned such that each of the cores 512A ... 512D is aligned, in the direction of the signal paths, with a respective core 532A ... 532D.

The position assignments also contributes to uniform electrical properties of the signal paths by keeping the legs of each differential pair generally together, including at the mating interface of the connector assembly. FIGS. 6A and 6B illustrate a cross section through the mating interface or other suitable portion, of a connector assembly, such as connector assembly 520. In the example illustrated in FIGS. 6A and 6B, the mating interface includes a cavity 640. Cavity 640 may be shaped and positioned similar to cavity 140A or 140B (FIG. 1). Accordingly, cavity 640 may receive a portion of a mating connector (not shown) that includes conductive elements with mating contact portions. The mating contact portions of the mating connector may each make contact with a corresponding mating contact within connector assembly 520.

In the configuration illustrated in FIGS. 6A and 6B, mating contacts 642A ... 642L are shown. These mating contacts, for example, may be positioned in positions 1 ... 12, respectively, defined by the RJ-45 standard. In this perspective, the mating contacts appear positioned in two lines 650 and 652. Lines 650 and 652 are generally parallel and on opposite sides of cavity 640.

FIG. 6A shows the mating contacts 642A ... 642L divided into groups 670A ... 670D. Each group is associated with a channel. Accordingly, in the illustrated embodiment, each group is shown to contain three mating contacts, sufficient to carry two legs of a differential signal and an associated ground. As shown, each of the groups 670A ... 670D contains two mating contacts on one side of cavity 640 and a third mating contact on an opposite side of cavity 640. The two mating contacts on the same side of cavity 640 may for a pair carrying the differential signal and the third may be associated with ground.

Accordingly, FIG. 6A shows that group 670A contains mating contacts 642G and 642H that carry a differential signal and are disposed on one side of cavity 640. Mating contact 642A, on the opposite side of cavity 640, forms the third contact of the group. Group 670B contains mating contacts 642B and 642C that carry a differential signal and are disposed on one side of cavity 640. Mating contact 642I, on the opposite side of cavity 640, forms the third contact of the group. Group 670C contains mating contacts 642D and 642E that carry a differential signal and are disposed on one side of cavity 640. Mating contact 642J, on the opposite side of cavity 640, forms the third contact of the group. Group 670D contains mating contacts 642K and 642L that carry a differential signal and are disposed on one side of cavity 640. Mating contact 642F, on the opposite side of cavity 640, forms the third contact of the group.

FIG. 6B shows an alternative position assignment according to some embodiments. In accordance with the assignments of FIG. 6B, each group contains three adjacent mating contacts on the same side of cavity 640. As illustrated, group 690A contains mating contacts 642B and 642C that carry a differential signal. Mating contact 642A, on the same side of cavity 640, forms the third contact of the group, which may be a portion of a ground conductor. Group 690B contains mating contacts 642E and 642F that carry a differential signal and are disposed on one side of cavity 640. Mating contact 642D, on the same side of cavity 640, forms the third contact of the group, which may be a portion of a ground conductor. Group 690C contains mating contacts 642H and 642I that carry a differential signal and are disposed on one side of cavity 640. Mating contact 670G, on the same side of cavity 640, forms the third contact of the group, which may be a portion of a ground conductor. Group 690D contains mating contacts 642K and 642L that carry a differential signal and are disposed on one side of cavity 640. Mating contact 642J, on the same side of cavity 640, forms the third contact of the group, which may be a portion of a ground conductor.

Figure 6C:
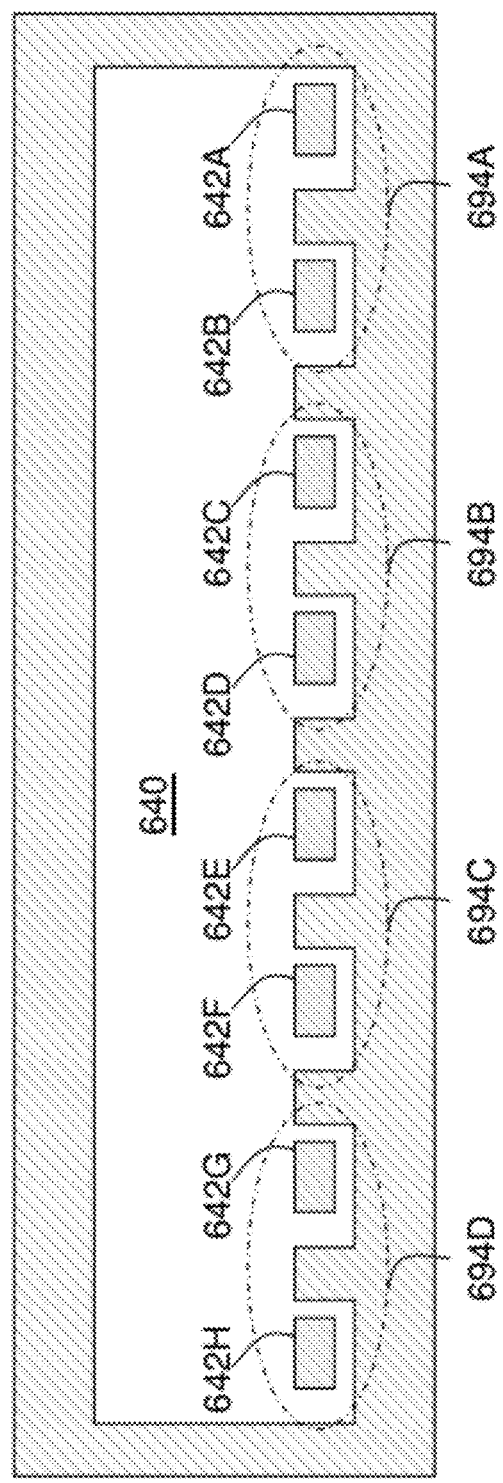
FIGS. 6A . . . 6C are cross sections through alternative embodiments of a mating interface portion of the connector illustrated in FIG. 5.

It should be appreciated that FIGS. 6A and 6B illustrate just two possible position assignments. In some embodiments, connector assembly 520 may be configured as an 8 pin jack, such as an 8 pin RJ-45 jack. In such embodiments, separate mating contacts may not be provided for ends, such as ends 218, that are connected to the center tap of the primary winding of the transformer of each of the isolation circuits. In such an embodiment, mating contacts, such as mating contact 142, may be disposed in a single line across one side of a cavity, such as cavity 640. FIG. 6C illustrates such an embodiment.

In FIG. 6C, the mating contacts 642A ... 642H are positioned in a single line along one side of a cavity 640. In this embodiment, eight mating contacts are illustrated. The mating contacts are divided into four groups 694A ... 694D, corresponding to four channels that may be supported in a connector. Each group 694A ... 694D contains two mating contact. As illustrated, group 694A contains mating contacts 642A and 642B that carry a differential signal in a channel. Group 694B contains mating contacts 642C and 642D that carry a differential signal in a channel. Group 694C contains mating contacts 642E and 642F that carry a differential signal in a channel. Group 694D contains mating contacts 642G and 642H that carry a differential signal in a channel.

In the configuration illustrated, the mating contacts for each of the pairs are positioned side by side in a line along one side of cavity 640. Though, it should be appreciated that other configurations are possible, even when an 8 pin connector is used.

Though mating contacts are not provided for conductive elements that are connected to the center tap of the secondary winding of the transformer of each of the isolation circuits, these ends may be connected to suitable conductive elements within the connector assembly 520. For example, the center taps of the primary windings may be connected together. Alternatively or additionally, each of the center taps may be connected to a conductive element with a contact tail adapted for connection to ground on the printed circuit board to which the connector assembly is mounted or may be connected to a conductive element connected to a cable sheath of a connection medium to which a plug, which may be inserted in cavity 640 is attached.

Also, FIGS. 6A ... 6C illustrate position assignments on the mating interface side of connector assembly 520. Similar pin assignments may be made at the tail side of the connector assembly. As shown in FIG. 1, a connector assembly 110 may contain two rows of tails 134. The connections between ends of the wires in the isolation circuits and contact tails may be assigned so as to improve the performance of the connector assembly in conveying high speed signals. In embodiments in which the primary winding of a transformer in each isolation circuit is connected to a tail designed for attachment to a printed circuit board, such position assignments may entail associating ends 218, 222 and 224 of each isolation circuit with a specific tail.

Figure 15:
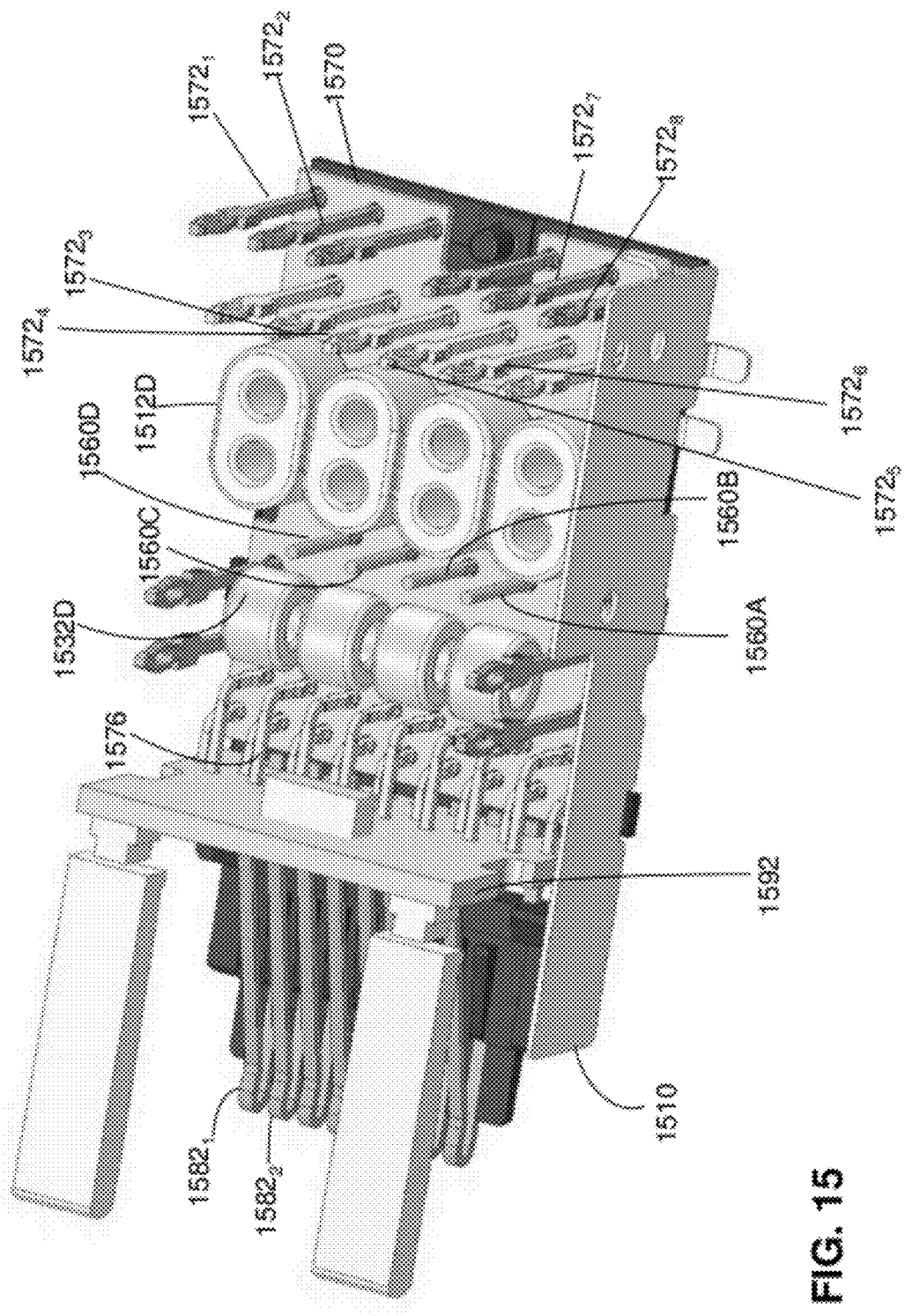
FIG. 15 is a sketch revealing alignment of components yielding multiple straight and uniform paths for signals to pass through a connector assembly including isolation circuits.

Such position assignments, for example, may be analogous to those in FIG. 6A or FIG. 6B. When the position assignments are analogous to those in FIG. 6A, ends 222 and 224 of each isolation circuit may be connected to adjacent tails in the same row. End 218 from the isolation circuit may be connected to a tail in the opposite row. Alternatively, when the position assignments are analogous to those in FIG. 6B, ends 222 and 224 of each isolation circuit may be connected to adjacent tails in the same row. End 218 from the isolation circuit may be connected to an adjacent tail in the same row. Such assignments, for example, are illustrated in FIG. 15 below.

Figure 7B:
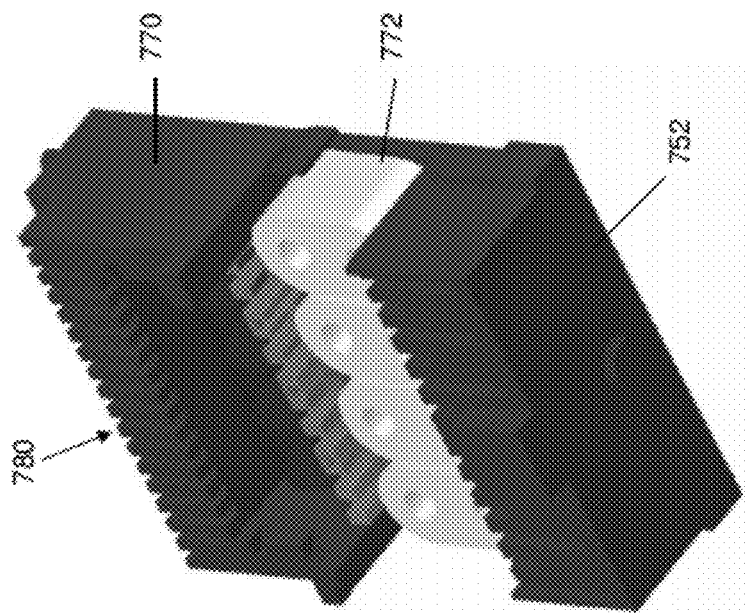
FIG. 7B is a sketch, from an alternative perspective, of the connector housing of FIG. 7A, with a choke cores further cut away.
Figure 7A:
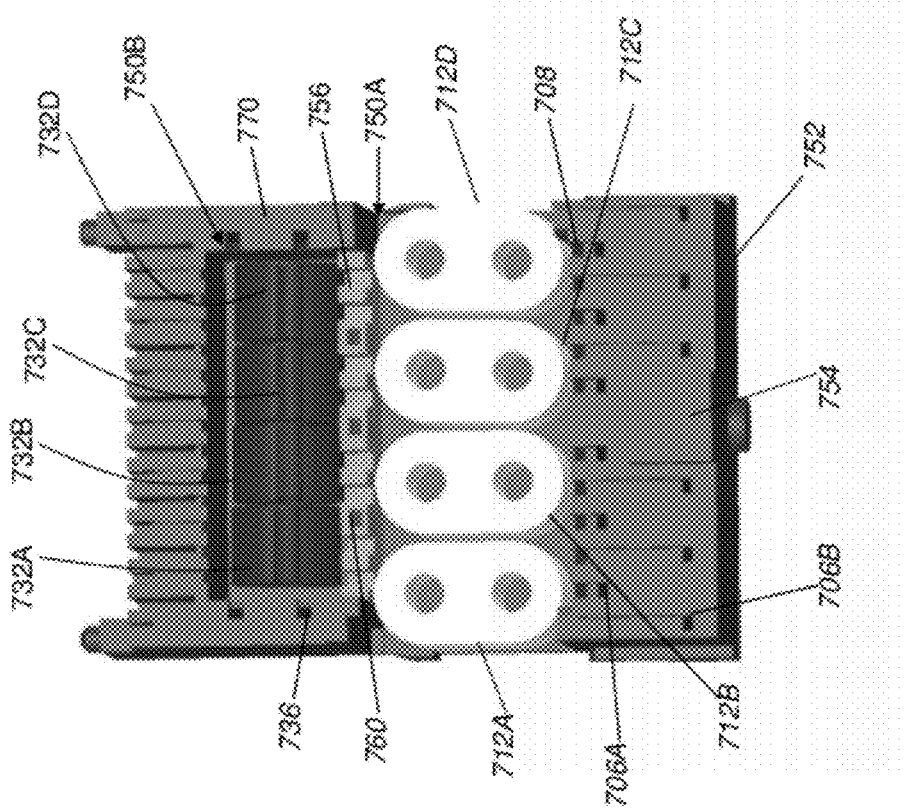
FIG. 7A is a sketch of a lower surface of a connector housing, with wires and contact tails cut away, according to some embodiments of the invention.

Regardless of the specific position assignments used, FIGS. 7A and 7B illustrates additional details of a manner in which a connector assembly may be constructed. FIGS. 7A and 7B, which provide two views of a portion of a connector assembly, illustrate cores 712A ... 712D, each of which may be a core of a transformer in an isolation circuit of a channel carrying a differential signal. Cores 732A ... 732D are also illustrated. Each of cores 732A ... 732D may be a core of a common mode choke in an isolation circuit. In each isolation circuit, a transformer and a common mode choke may be connected as shown, for example, in FIG. 4. Though, for simplicity of illustration, the wires wound around cores 712A . . . 712D and 732A . . . 732D are not shown.

As shown, cores 712A . . . 712D are positioned within a cavity 750A in an insulative housing 752. Cores 732A . . . 732D are positioned within a cavity 750B in housing 752. Housing 752 may be formed using materials and techniques as are known in the art for forming a housing of a connector. For example, housing 752 may be molded from an insulative polymer filled with glass fiber or other reinforcing materials.

Housing 752 may be formed with exterior dimensions that conform to a standard for connectors used in network interfaces. The interior dimensions and features may facilitate integration of multiple isolation circuits that support differential signals in each of multiple channels. Here, four such isolation circuits are illustrated.

One such adaptation to support isolation circuits is the incorporation of cavities 750A and 750B. As shown, cavity 750A is wider than cavity 750B to accommodate the larger binocular cores used in forming transformers used in the isolation circuits in a configuration that allows the common mode choke and transformer of each isolation circuit to be positioned in a line. Though, to accommodate the transformers in a configuration in which the components of each isolation circuit are positioned in parallel, a wall 770 of housing 754 has a relieved portion 772. As can be seen in FIGS. 7A and 7B, relieved portions 772 increases the width of cavity 750A, allowing four transformers to be positioned in parallel. Accordingly, relieved portions 772 allows for four isolation circuits to be positioned with short and generally uniform signal paths.

A further adaptation illustrated in FIGS. 7A and 7B is the incorporation of a wall 756 that separates cavities 750A and 750B. In addition to aiding in positioning the cores, wall 756 may provide attachment points to which conductive elements within a connector assembly can be attached. The conductive elements, for example, may provide attachment points for one or more of the ends of the wires used in the isolation circuits. In the embodiment illustrated in FIG. 3 or 4, for example, end 320 is formed on a wired extending from a transformer as a center tap. In some embodiments, the wire forming the center tap may extend fully to a point within a connector assembly to which the center tap is to be connected. In the embodiment illustrated, such a connection would entail routing the wire forming the center tap across or through cavity 750B.

Alternatively, in some embodiments, wall 750 maybe configured to facilitate use of shorter wire lengths for end 320. For example, as shown, wall 750 may support conductive elements to which an end, such as end 320 may be connected. In the illustrated embodiment, wall 576 contains holes, of which hole 760 is numbered, into which conductive elements within the connector assembly may be inserted. These conductive elements may have exposed portions to which ends, such as end 320, may be connected. As a specific example, the conductive element in a hole, such as hole 760, may include a portion shaped as a post to which an end 320 may be soldered. The conductive elements may then complete the connection of the center tap of the transformer to a desired location within the connector assembly. The conductive elements exposed in wall 756 may connect the center taps together, to ground and/or to any other suitable location.

Housing 752 may also include features shaped to receive conductive elements of the connector assembly. For example, forward edge 780 may be shaped to receive conductive elements that have springy portions forming mating contacts, such as mating contact 142 (FIG. 1). In the embodiment illustrated, those features may include slots to receive the conductive elements, though any suitable features may be used.

Other features may receive conductive elements that have portions shaped as contact tails that extend through lower surface 754 such that the tails are positioned for attachment to a printed circuit board. For example, one or more rows of holes may be provided to receive conductive elements that form tails, such as tail 134 (FIG. 1). In this example, a row of holes, of which hole 706A is numbered, is provided for this purpose. A second row of holes, of which hole 706B is numbered, is also provided.

Connections between the tails and the ends that are intended to be coupled to components on a printed circuit board through such tails may be formed through conductive elements that have features adapted for attachment of wire ends. For example, each of ends 318, 322 and 324 may be soldered to a portion of a conductive element. These portions of the conductive elements may be exposed through other holes in lower surface 754. For example, a further row of holes, of which hole 708 is numbered, may be provided to receive portions of conductive elements to which ends, such as ends 318, 322 and 324 of each of the isolation circuits may be soldered. The ends of the conductive elements exposed through holes, such as hole 708, may connect within housing 752 to tails extending from surface 754, for example.

Figure 7C:
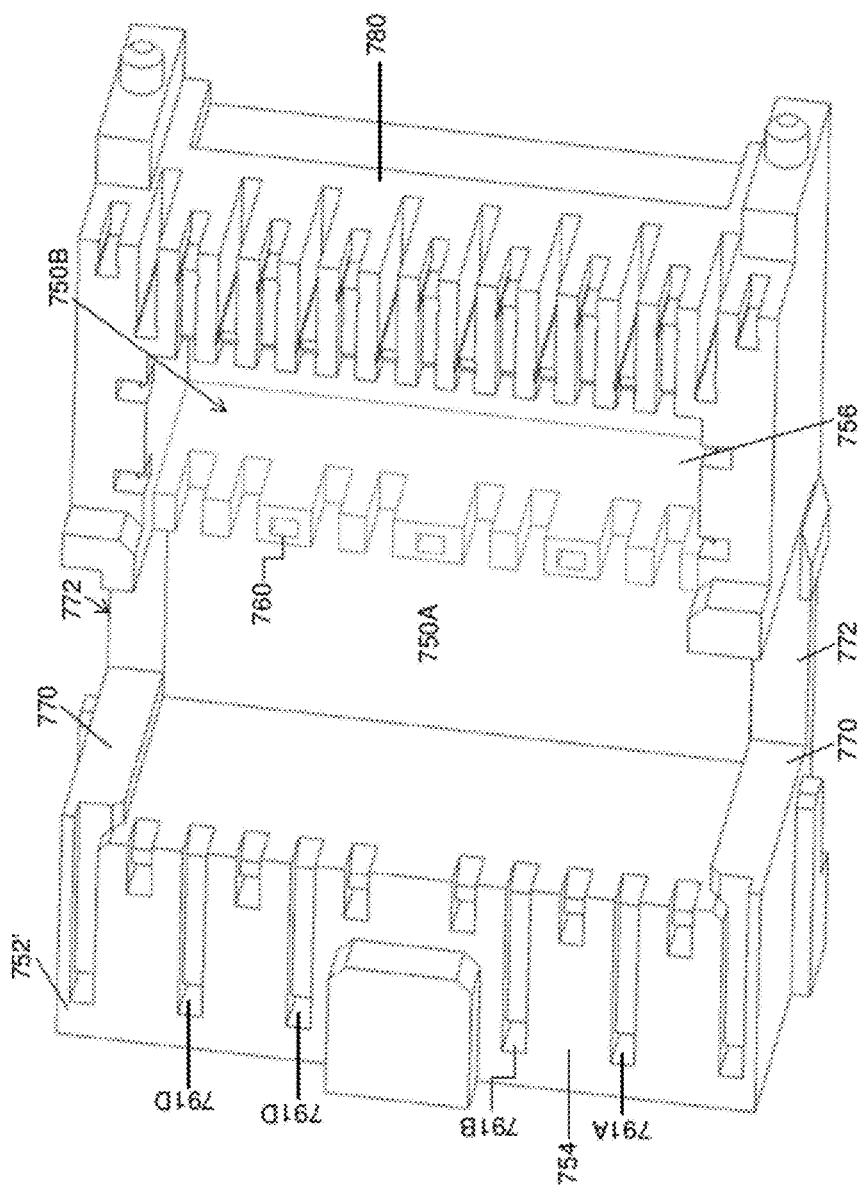
FIG. 7C is sketch of a connector housing without transformers or common mode chokes.

FIG. 7C illustrates a housing 752' that may be used in place of housing 752 illustrated in FIGS. 7A and 7B. In this configuration illustrated in FIG. 7C, cores 712A . . . 712D and 732A . . . 732D are shown removed from housing 752'. Though, as can be seen, housing 752' includes cavities 750A and 750B for receiving those cores. Housing 752' similarly includes relieved portions 772 to accommodate the cores.

FIG. 7C illustrates that variations in the structure of the connector housing are possible. In this example, housing 752' differs from housing 752 in that slots 791A . . . 791D are provided to receive conductive elements. In this example, the conductive elements placed in slots 791A . . . 791D may contain contact tails adapted for attachment to a printed circuit board, such as printed circuit board 102 (FIG. 1). Each of the slots 791A . . . 791D may contain, for example, a pair of conductive elements, which is adapted to carry a differential pair during operation of a connector made using housing 752'. Though, it should be appreciated that the specific configuration of the contact tails and their mounting within a connector housing is not critical to the invention.

As described above, FIG. 3 illustrates an embodiment of an isolation circuit, but other embodiments may also be used. FIGS. 8A . . . 8D provide examples of alternative embodiments. Each of the alternative embodiments includes a transformer and a common mode choke connected in series. Though, it is not critical to the invention that both components be present. Also, each of the alternative embodiments is shown with a common mode choke seven turns. This configuration is not critical to the invention, and a common mode choke with any number of turns or other construction parameters may be used. Further, each of the alternative embodiments is shown with a transformer with six turns and a center tap in each of the primary and secondary windings, such that each half of each winding has three turns. This configuration also is not critical to the invention, and any suitable number of turns and other construction parameters may be used.

In FIG. 8A, common mode choke 820 has seven turns around a torroidal core, and may be constructed using known techniques or as described above in connection with FIG. 3. Transformer 810 is formed with two primary windings, 814A and 814B and two secondary windings 816A and 816B. In this example, a wire forming primary winding 814A may be twisted together with a wire forming secondary winding 816B. Similarly, a wire forming primary winding 814B may be twisted together with a wire forming secondary winding 816A. Though, unlike in FIG. 3, wires forming primary windings 814A and 814B are not twisted together all the way to ends 322 and 324.

In FIG. 8B, common mode choke 840 has seven turns around a torroidal core, and may be constructed using known techniques or as described above in connection with FIG. 3. Transformer 830 is formed with two primary windings, 834A and 834B and two secondary windings 836A and 836B. In this example, a wire forming primary winding 834A may be twisted together with a wire forming secondary winding 836B. Similarly, a wire forming primary winding 834B may be twisted together with a wire forming secondary winding 836A. Though, unlike in FIG. 3, wires forming primary windings 834A and 834B are not connected and wires forming secondary windings 836A and 836B are not connected. Rather, wires forming primary winding 834B and secondary winding 836B are connected, as illustrated.

In FIG. 8C, common mode choke 860 has seven turns around a torroidal core, and may be constructed using known techniques or as described above in connection with FIG. 3. Transformer 850 is formed with two primary windings, 854A and 854B and two secondary windings 856A and 856B. In this example, a wire forming primary winding 834A may be twisted together with a wire forming secondary winding 836B. Similarly, a wire forming primary winding 834B may be twisted together with a wire forming secondary winding 836A. As in FIG. 3, wires forming primary windings 834A and 834B are twisted together at ends 322 and 324. However, unlike in FIG. 3, the wires forming secondary windings 836A and 836B are twisted together near ends 326 and 326. Additionally, these wires, or wires connected to them, are twisted together and wound to form common mode choke 860. Though, in this example, the windings may be formed in part by winding a wire connected to secondary winding 856A and a wire connected to secondary winding 856B. In the specific example of FIG. 8C a wire connected to secondary winding 856A is wound four times and wire connected to secondary winding 856B is wound three times providing a total of seven turns for the common mode choke.

The embodiment illustrated in FIG. 8D is similar to the embodiment of FIG. 8C with a common mode choke 880 and a transformer 870 with primary windings 874A and 874B and secondary windings 876A and 876B. However, in the embodiment of FIG. 8D, both primary windings 874A and 874B have a center tap. The wires forming these center taps are twisted together to end 318.

Regardless of the specific configuration of the isolation circuit, FIGS. 9A . . . 9E illustrate steps that may be used in constructing a suitable transformer. In this example, a transformer such as transformer 310 is illustrated, but similar techniques may be applied to manufacture transformers of other suitable configurations.

The process begins in FIG. 9A with wires 910 and 912. Wire 910 may form a primary winding. Wire 912 may form a secondary winding. A central portion of wire 910 is twisted to form a center tap 914.

FIG. 9B shows a subsequent step in which wires 910 and 912 are twisted together to form a wire subassembly 916A. The steps illustrated in FIGS. 9A and 9B may be repeated to form an additional wire subassembly 916B. Though, in the second wire subassembly, wire 910 may serve as a secondary winding and wire 912 may serve as the primary winding. In this way, wires for two primary windings, one of which has a center tap, and two secondary windings, one of which has a center tap may be formed.

In FIG. 9C, free ends 924A and 924B of wire subassemblies 916A and 916B may be inserted into holes 922A and 922B, respectively, of a core 920.

In FIG. 9D, free end 924A may be inserted through hole 922B. In FIG. 9E, free end 924B may be inserted through hole 922A, thus creating two turns for each winding around core 920. When two turns are desired, the process of making transformer 950 may stop in the state illustrated in FIG. 9E. If a transformer with additional turns is desired, the process of inserting the free ends 924A and 924B through the holes 922A and 922B may be repeated. For example, those steps may be repeated once to create a transformer with four turns or twice to create a transformer with six turns.

FIG. 10 illustrates manufacture of a common mode choke. As shown, wires 1012 and 1014 may be wound together around a core 1010. Here, 7 turns are illustrated.

In FIG. 11, the common mode choke 1010 of FIG. 10 is connected to the transformer 950 manufactured according to FIGS. 9A . . . 9E. As shown, wire 1012 may be connected to one end of the wire in each wire subassembly 916A and 916B designated as the secondary winding. Wire 1014 may be connected to the other end of the wire in each wire subassembly 916A and 916B designated as the secondary winding. Such connections may be made with solder or by any other suitable means. It should be appreciated that the common mode choke may be attached to the transformer at any suitable time during the manufacture of a connector. In some embodiments, for example, the common mode choke may be attached to the transformer before insertion into a housing. In other embodiments, the transformer and common mode choke may be formed and inserted separately into a housing. The transformer and common mode choke may then be connected directly to each other while in the housing. Alternatively or additionally some or all of the connections between the transformer and common mode choke may be formed by connecting wires of each to conductive elements within the housing. As noted above, any suitable connection mechanism may be used for these connections, including one or more printed circuit boards within the housing.

The isolation circuit formed as illustrated in FIG. 11 may be incorporated into a housing for a connector assembly to form an integrated connector for use in creating a network interface. For a connector with multiple channels, multiple such isolation circuits may be integrated, as described above. Though, it is not a requirement that the isolation circuits be integrated into a connector housing In some embodiments, the component thus formed by integrating isolation circuits into a housing may be mounted to a printed circuit board or other substrate, where it can be connected to other components of a network interface or used in any other suitable way.

Figure 12:
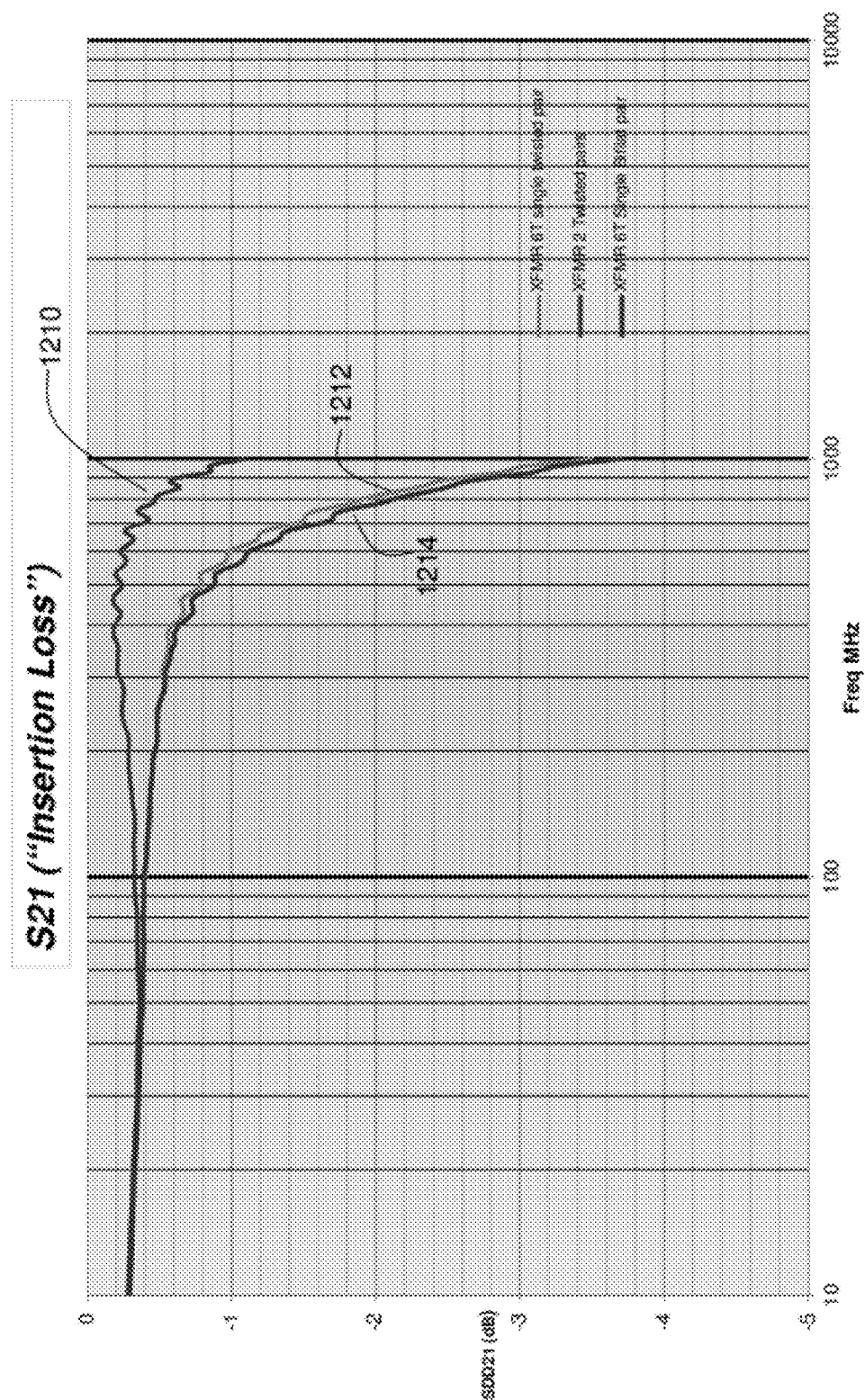
FIG. 12 is a plot showing relative insertion loss for three different transformer constructions.

Regardless of the form of the housing into which such isolation circuits are integrated, use of some or all of the techniques described herein may result in improved electrical performance for high speed data networks. FIG. 12 illustrates an example of such improvement. In FIG. 12, an example of insertion loss is provided. Line 1210 represents insertion loss of an isolation circuit in which two primary and two secondary windings are connected in parallel. Line 1212 represents insertion loss for an isolation circuit using a transformer with a single primary winding and a single secondary winding of an equivalent number of turns, with the wires forming those windings twisted together. Line 1214 represents insertion loss for an isolation circuit using a transformer with a single primary winding and a single secondary winding of an equivalent number of turns, with the wires configured as a Bifilet pair. As can be seen in FIG. 12, there is an improvement in insertion loss at frequencies above 100 MHz, meaning that the isolation circuit represented by line 1210 can support higher frequency signals, such that it provides improved performance over the frequency range used to transmit data for a 10G Ethernet. As a specific example, FIG. 12 illustrates that the insertion loss is below 2 dB for frequencies between 100 MHz and 1000 MHz.

Figure 13:
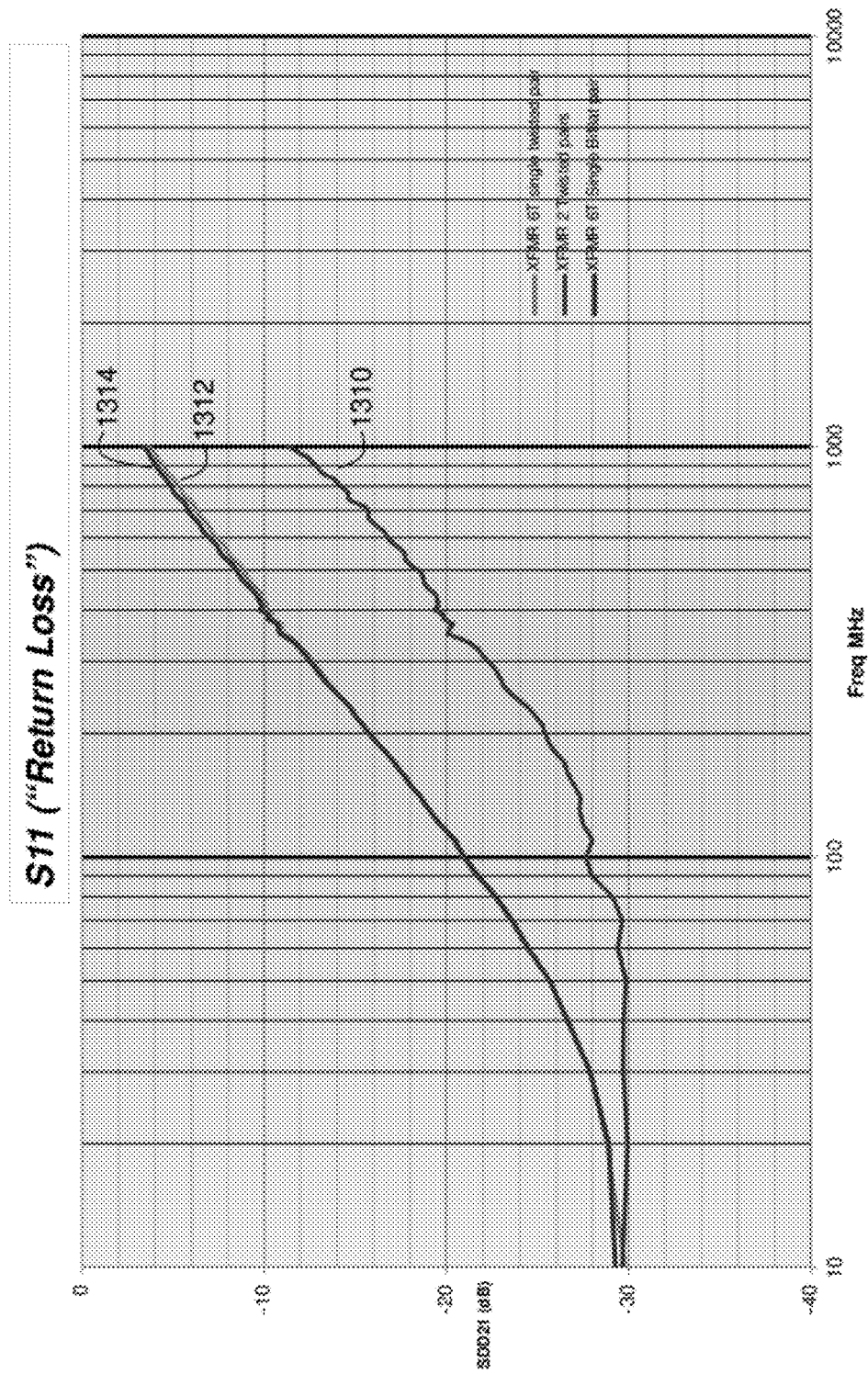
FIG. 13 is a plot showing return loss for three different transformer constructions.

FIG. 13 illustrates that techniques as described herein may also provide an improvement in return loss at frequencies of interest for 10G Ethernet. Line 1310 illustrates return loss of an isolation circuit in which two primary and two secondary windings are connected in parallel. Line 1312 represents return loss for an isolation circuit using a transformer with a single primary winding and a single secondary winding of an equivalent number of turns, with the wires forming those windings twisted together. Line 1214 represents return loss for an isolation circuit using a transformer with a single primary winding and a single secondary winding of an equivalent number of turns, with the wires configured as a Bifilet pair. As can be seen in FIG. 13, there is an improvement in return loss at frequencies above 100 MHz, meaning that the isolation circuit represented by line 1210 can support higher frequency signals, such that it provides improved performance over the frequency range used to transmit data for a 10G Ethernet. As a specific example, FIG. 13 illustrates that the return loss is below −10 dB for frequencies between 100 MHz and 1000 MHz. In this case, a return loss, which is more negative indicates better performance because less incident energy is being reflected back to the input.

Having thus described several aspects of at least one embodiment of this invention, it is to be appreciated various alterations, modifications, and improvements will readily occur to those skilled in the art.

For example, the techniques described herein need not be used together. These techniques may be used in any suitable combination to provide desired connector performance.

As another example, though embodiments are illustrated in which an isolation circuit includes a transformer and a common mode choke, a common mode choke may be omitted in some embodiments.

Further, embodiments were described in which the isolation circuit has a specific orientation, with the primary winding of the transformer connected to either components within an electronic device or coupled to mating contacts of a connector form making connection with conductors within a network connection medium. It should be appreciated that the orientation of the isolation circuit is not critical to the invention and, for any embodiment in which an orientation is described, a comparable embodiment may be formed with the opposite orientation. As one alternative, a housing, such as housing 752, may be configured to receive conductive elements with tails rather than mating contact portions as described above in connection with FIG. 7.

FIGS. 14A . . . FIG. 14E and FIG. 15 illustrate such a connector assembly. FIG. 14A illustrates a connector assembly 1410 including an isolation circuit as described above. As with connector assembly 110 (FIG. 1) connector assembly 1410 includes two connectors enclosed in a conductive cage. The cage, along with the connectors, is mounted as an assembly to a printed circuit board 1402. Though not shown for simplicity, circuit board 1402 may contain a transceiver and other components forming a network interface or other portions of an electronic system. In use, circuit board 1402 may be installed in an electronic device to position connector assembly 1410 in an opening of a panel 1450, shown partially cut away in FIG. 14A.

In this example, connector assembly 1410 provides two receptacles. Each receptacle includes a cavity, shown as cavities 1440A and 1440B in FIG. 14A Each of the cavities is configured to receive a plug, which may terminate a cable carrying signals coupled through connector assembly 1410. In this example, connector assembly 1410 may be configured to receive a plug suitable for coupling 10G Ethernet signals. As a specific example, within each of cavities 1440A and 1440B, mating contact portions of eight conductive elements may be positioned for making contact with corresponding conductive elements in a plug type connector. The eight mating contact portions may couple four differential signals through each of the connectors of connector assembly 1410.

Each of the connectors may have associated with it one or more indicator lights. In this example, each of the connectors has two indicator lights. Here LEDs 1460A and 1462A serve as status indicators for a connection made through cavity 1440A Likewise, LEDs 1460B and 1462B serve as indicators of the status of a connection made through cavity 1440B.

Figure 14B:
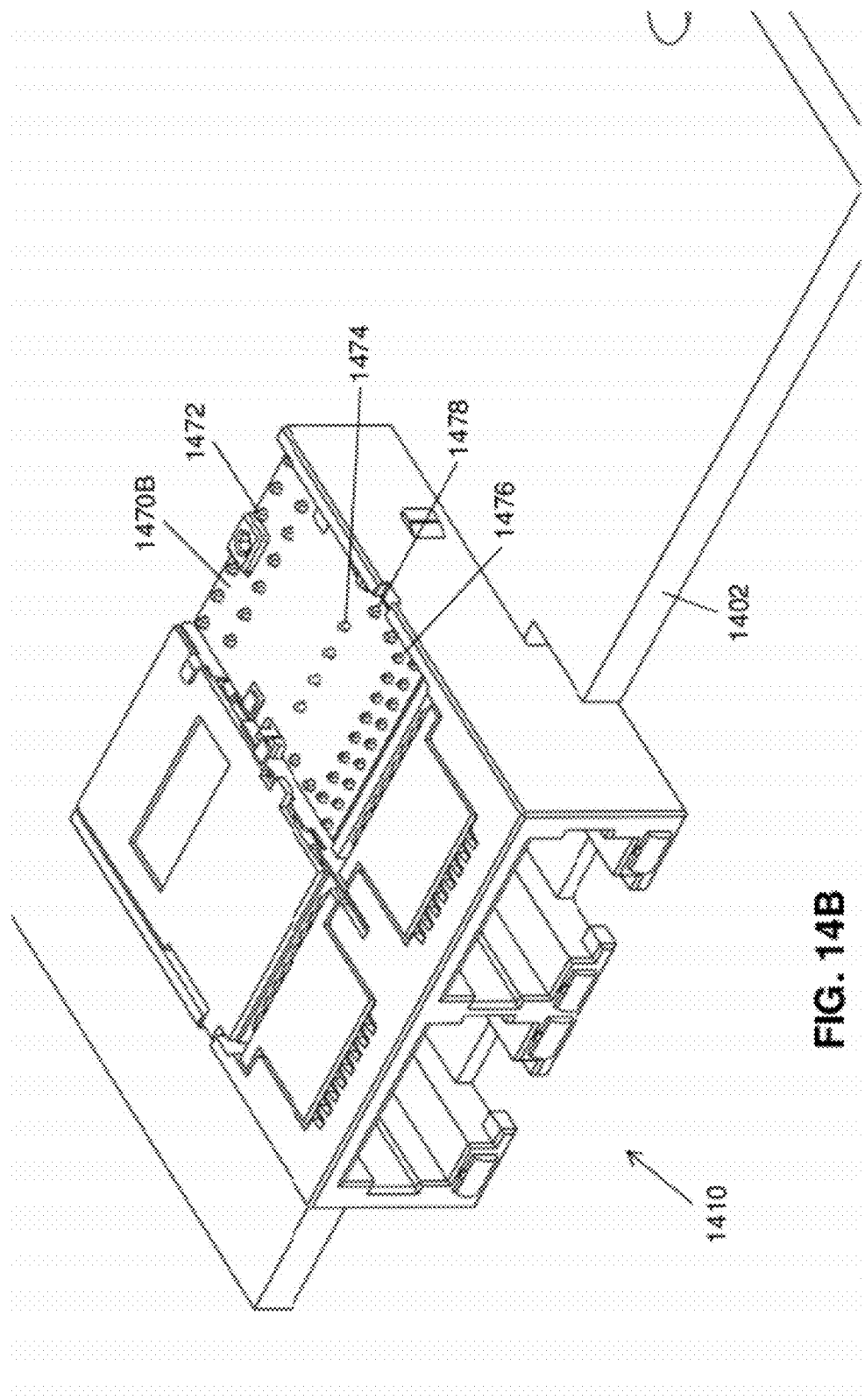
FIGS. 14B . . . 14E are sketches of the connector assembly of FIG. 14A with elements cut away to reveal interior detail of the connector assembly.

Integration of isolation circuits into the connectors of connector assembly 1410 is illustrated in FIGS. 14B . . . 14E. FIG. 14B shows further details of connector assembly 1410. FIG. 14B illustrates connector assembly 1410 with portions of the cage and other housing members removed. In the state shown in FIG. 14B a printed circuit board 1470B mounted within the one of the connectors of connector assembly 1410 is visible. Printed circuit board 1470B may be manufactured in any suitable way, including using known printed circuit board manufacture techniques. Printed circuit board 1470B may provide a ground plane, as is known in the art of printed circuit board design, to which multiple conductive elements may be connected to provide a common ground. In this example, multiple conductive elements, of which conductive element 1472 is numbered, are shown protruding through printed circuit board 1470B near the rear edge of the connector. These conductive elements, for example, may represent one end of conductive elements that have at an opposing end contact tails for attaching to printed circuit board 1402.

The conductive elements, such as 1472, may be attached to printed circuit board 1470B in any suitable way. In some embodiments, conductive elements, such as conductive element 1472, may be soldered to a surface of printed circuit board 1470B. Each of the conductive elements, for example, may be soldered to a conductive pad or other suitable structure on printed circuit board 1470B. These pads may be connected to conductive structures within the printed circuit board 1470B. For example, using printed circuit board manufacturing techniques as are known in the art, traces within a printed circuit board may interconnect conductive structures.

Such an approach is an example of a mechanism by which each contact tail attached to printed circuit board 1402 is coupled to a suitable conductive element within the connector assembly. For example, contact tails connected to printed circuit board 1402 in a such a way as to couple a single into the connector assembly may be connected through printed circuit board 1470B to another conductive structure where a connection to an isolation circuit is made. Each of the wires serving as an input to the isolation circuit, such as are illustrated by ends 322, 324 and 318 (FIG. 3), may be soldered to pad on printed circuit board 1470B. Each pad may in turn be coupled through a trace or ground plane, as appropriate, within printed circuit board 1470B to a further pad where a connection to a conductive element, such as conductive element 1472, is made.

In such an embodiment, for example, the transformers of the isolation circuits may be attached to printed circuit board 1470B before it is inserted into the connector assembly as illustrated in FIG. 14B. The conductive elements, such as conductive element 1472, may then be soldered to printed circuit board 1470B, completing the connection between the conductive elements on which contact tails are formed and the isolation circuit. Though, it should be appreciated that the order in which the components of connector assembly 1410 are installed and connected together is not critical to the invention. In some embodiments, for example, wires forming windings of a transformer or common mode choke of the isolation circuit may be attached directly to conductive elements providing contact tails.

Similarly, conductive elements that form mating contact portions for the connector assembly may also be attached to printed circuit board 1470B. Accordingly, FIG. 14B shows conductive elements, of which conductive element 1476 is numbered, along a forward edge of printed circuit board 1470B. Conductive elements running into cavity 1440B (FIG. 14A) are, in the embodiment illustrated, connected to printed circuit board 1470B along the forward edge of the printed circuit board 1470B. The conductive elements along forward edge, such as conductive element 1476, carrying signals into cavity 1440B may be connected, directly or indirectly, to outputs of the isolation circuit. In the embodiment illustrated in FIG. 3, ends 342 and 344 may be connected to printed circuit board 1470B and routed through traces or other conductive structures within printed circuit board 1470B to conductive elements that form mating contacts extending into cavity 1440B.

As with connections to the isolation circuit at the rearward edge of printed circuit board 1470B, these connections between the isolation circuit and the conductive elements may be made in any suitable way through printed circuit board 1470B. Though, in other embodiments, these connections may be made directly, such as by soldering wires of the isolation circuit to the conductive elements. Though, in some embodiments, making a connection between the isolation circuit and the printed circuit board 1470B may allow the components of the isolation circuit to be mounted on the printed circuit board such that the printed circuit board together with the isolation circuits may be inserted in to a connector housing as a unit. Though, in other embodiments, the isolation circuit may be separately inserted into the housing and connections may be made directly or indirectly, such as through printed circuit board 1470B.

Other conductive elements may also be attached to printed circuit board 1470B to make, or facilitate making, other connections relating to the isolation circuit. Conductive elements, may be positioned as appropriate for making other connections. In the example of FIG. 14B, conductive elements, of which conductive elements 1474 is numbered, are shown protruding through a central portion of printed circuit board 1470B. In some embodiments, these conductive elements serve as internal connection points that are not routed externally to the connector housing as contact tails or mating contacts. For example, as shown in FIG. 3, end 320 representing the center tap of a secondary transformer of the isolation circuit is intended to be connected to ground. Conductive element 1474 may serve as a mechanism to connect the center tap, at end 320 in the example of FIG. 3, to a common ground reference. In this example, that ground reference may be established by a ground plane within printed circuit board 1470B. Accordingly, the connector of FIG. 14B shows four conductive elements, such as conductive element 1474. Each of these conductive elements may server as a connection point for a center tap of an isolation circuit for one of the channels within the connector assembly. These four conductive elements may thus be connected together to a common ground through the printed circuit board 1470B.

Other conductive element may be connected to printed circuit board 1470B for other purposes. For example, FIG. 14B shows conductive elements, of which conductive element 1478 is numbered, along a side portion of printed circuit board 1470B. In this example, the conductive elements, such as conductive element 1478, carry control signals for LED status indicators 1460B and 1462B. Accordingly, conductive elements, such as conductive elements 1478 may have on their opposing ends, contact tails for attaching to printed circuit board 1402 to carry control signals for the status indicators into the connector assembly. In this example, those control signals may be routed through printed circuit board 1470B to corresponding conductive elements along the forward edge of 1470B where they are attached to other conductive elements that route the signals into the mating interface portion of the connector.

Use of a printed circuit board, such as printed circuit board 1470B provides a suitable mechanism for interconnecting the isolation circuit to other components within the connector assembly. Though, it should be appreciated that some or all of the connections may be made directly or through other intermediary conductive components without use of printed circuit board 1470B.

Figure 14C:
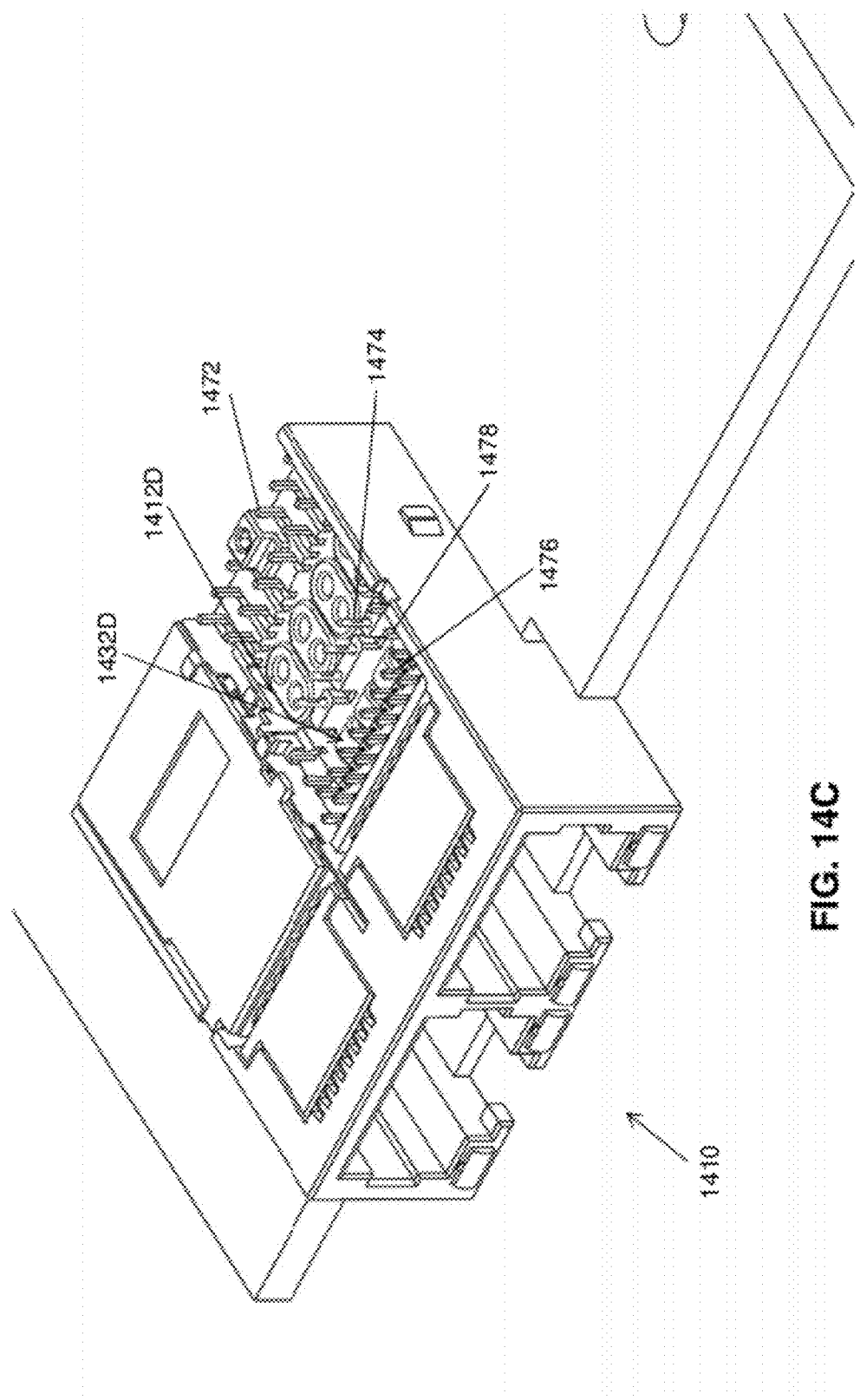
FIG. 14A is a sketch of a connector assembly including an isolation circuit according to an alternative embodiment.

FIG. 14C illustrates further detail of connector assembly 1410. In the state illustrated in FIG. 14C, printed circuit board 1470B is not shown, revealing components below printed circuit board 1470B. In embodiment in which components of the isolation circuits are inserted into a connector housing without first being attached to printed circuit board 1470B, FIG. 14C may represent a stage of the manufacture of a connector assembly 1410. In embodiments in which components of the isolation circuits are first attached to printed circuit board 1470B. FIG. 14C may be regarded as illustrating positioning of the components in a finalized assembly but not necessarily a stage in the manufacture of the connector assembly.

FIG. 14C illustrates the conductive elements shown in FIG. 14B protruding through printed circuit board 1470B. Accordingly, conductive elements, such as conductive element 1472, are shown along the rearward edge of the connector housing. Conductive elements, such as conductive element 1476 are shown along the forward edge of the connector housing. Conductive elements, such as conductive elements 1474, are shown along the central portion of the connector housing. Conductive elements, such as conductive element 1478, are shown along a side portion of the connector housing. These conductive elements are shown in the same position as illustrated in FIG. 14B, and may facilitate connections as described above in connection with FIG. 14B.

FIG. 14C, like FIG. 5 illustrates four channels within the same connector housing. Accordingly, four transformer cores, of which core 1412D is numbered, are illustrated in FIG. 4C. In line with the four transformer cores, are four common mode choke cores, of which core 1432D is numbered. For simplicity of illustration, the windings of the transformers and common mode chokes are not illustrated in FIG. 14C. As described above in connection with FIG. 14B, those windings may be electrically and mechanically attached directly to the conductive elements or may be indirectly connected through intermediary conductive members, such as may be contained within printed circuit board 1470B (FIG. 14B). For example, wires forming windings of either the transformers and/or the common mode chokes may take advantage of the post-like construction of the conductive elements extending from the connector housing as illustrated in FIG. 14C. The wires forming those windings may be wrapped around the post-like elements or mechanically secured in any other way. Alternatively or additionally, solder conductive adhesive or other suitable connection mechanism may be employed to form a mechanical and/or electrical connection between the wires forming the windings and the conductive elements as illustrated.

The transformers and common mode chokes may be secured within the connector housing in any suitable way. In the embodiment illustrated in FIG. 14C, cavities are formed within the housing. For example, the cores, such as core 1412D around which the transformers are wound, are positioned in a cavity, which may be similar in shape to cavity 750A (FIG. 7C). The cores, such as core 1432D, around which the common mode chokes are wound, may be positioned in a separate cavity, such as cavity 750B (FIG. 7C). Though the specific mechanism used to position the elements of isolation circuits are not critical to the invention, and any suitable mechanism may be used.

Figure 14D:
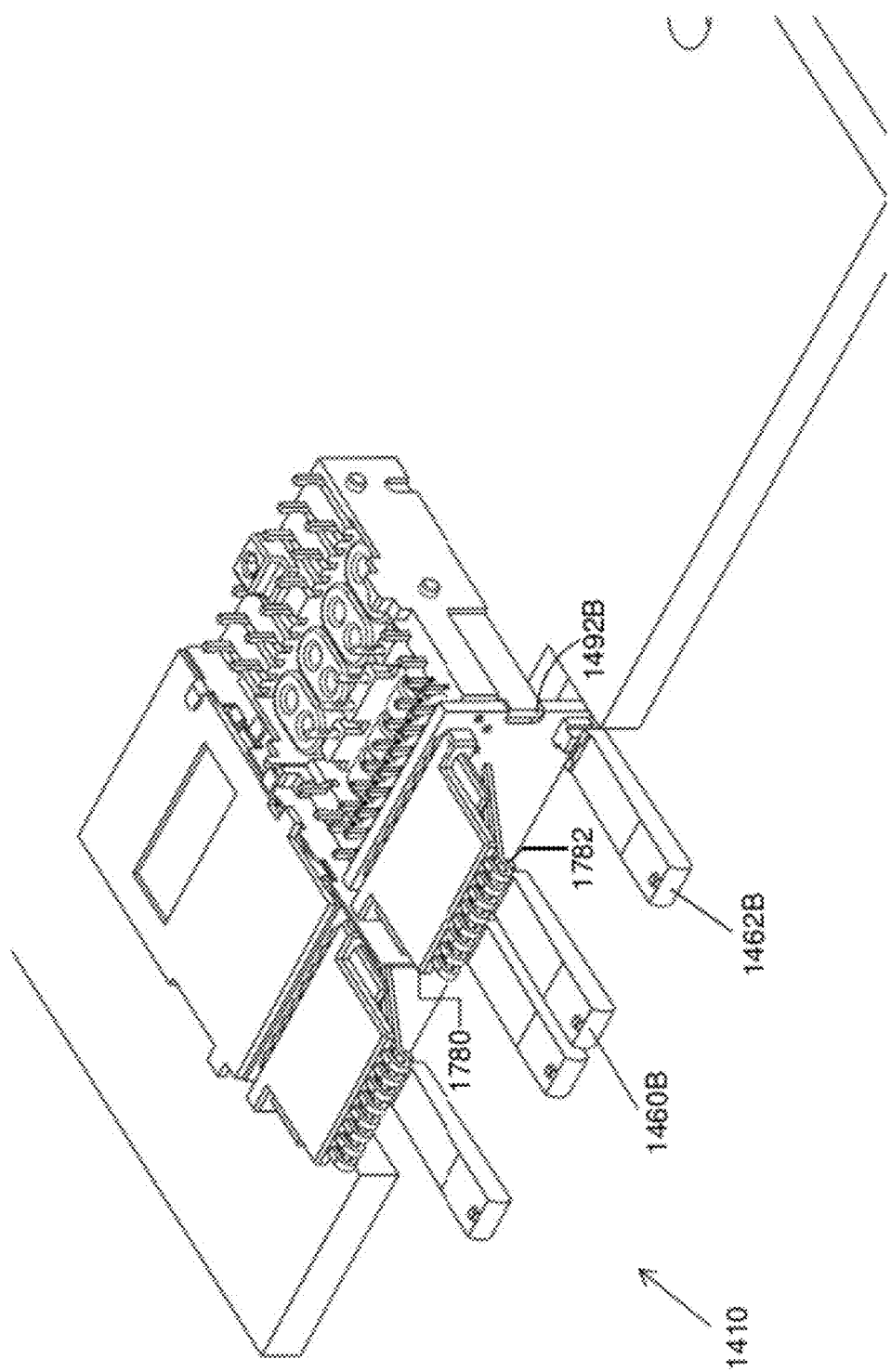
Figure 14E:
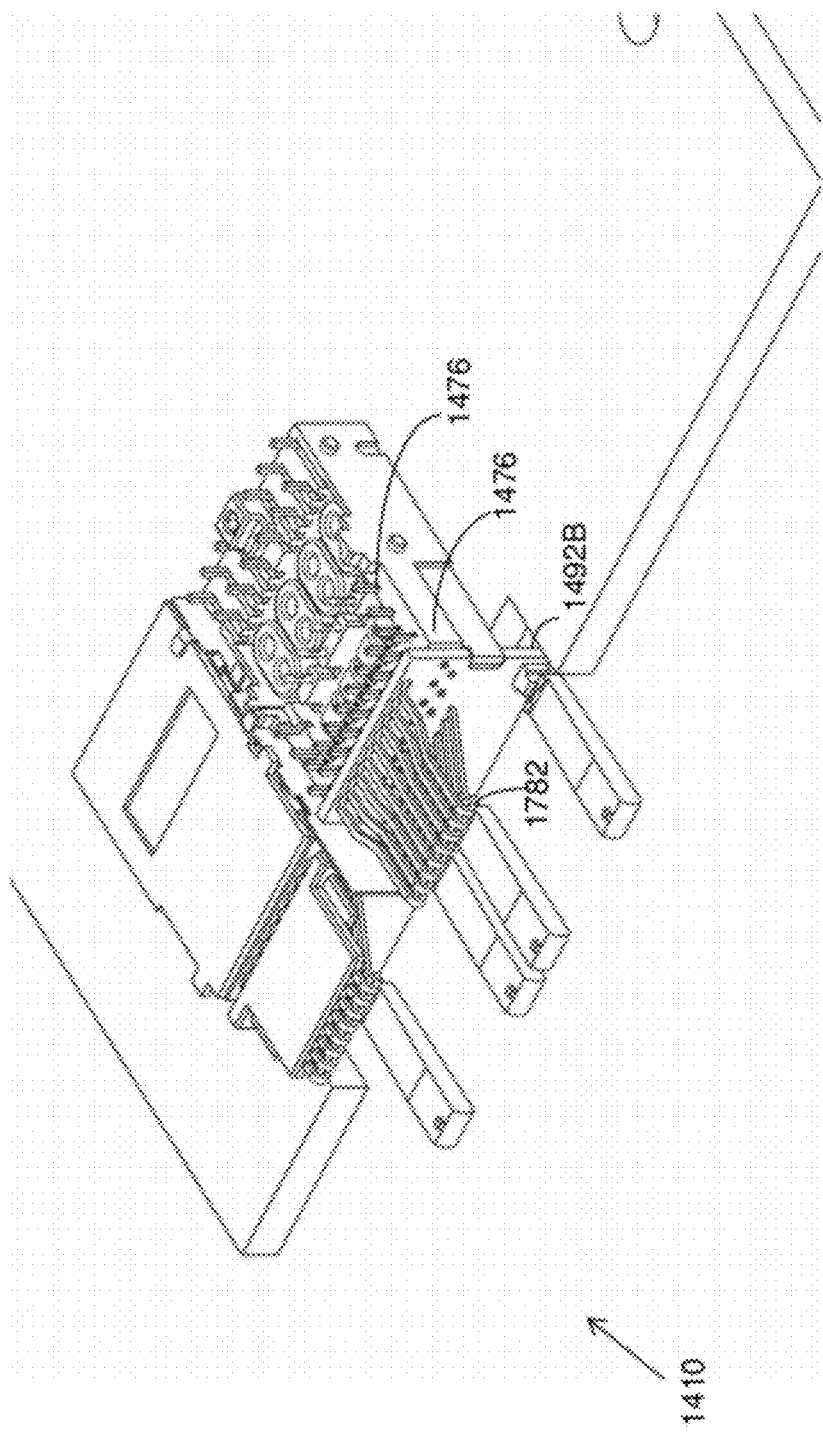

FIG. 14D reveals further detail of connector assembly 1410. FIG. 14D shows connector assembly 1410 with additional portions of the housing removed to reveal additional details of the construction. In this example, portions of the connector housing forming the mating interface have been removed to reveal a sub-assembly 1780. Sub assembly 1780 hold conductive elements, of which conductive element 1782 is numbered.

As can be seen, one end of conductive elements 1782 is positioned within cavity 1440B (FIG. 14A). That end is shaped as a cantilever beam and serves as a mating contact portion. A second portion of the conductive elements, such as conductive element 1782, are imbedded within a housing forming sub-assembly 1780. The housing may be an insulative material which may be over molded on the conductive elements.

In the example illustrated in FIG. 14D, sub-assembly 1780 is attached to a second printed circuit board 1492B. In this example, the conductive elements, such as conductive element 1476 along the forward edge of the connector housing, are connected to printed circuit board 1492B as well as to printed circuit board 1470B. In this way, a connection is provided between printed circuit board 1470B and printed circuit board 1492B. This connection provides a signal path connection between printed circuit board 1470B, and the isolation circuits which may be connected to printed circuit board 1470B, and the mating contact portions of the conductive elements, such as conductive element 1782 in the mating interface portion of the connection. Additionally, ground connections may be made between printed circuit board 1470B and printed circuit board 1492B. Other connections may be made in this way. For example, connections to couple signals controlling the LEDs 1460B and 1462B may be made through printed circuit boards 1470B and 1492B, Accordingly, FIG. 14D also shows LEDs 1460B and 1462B attached to printed circuit board 1472B.

As with other aspects of the connector assembly 1410, the components illustrated need not be assembled in a sequence as may be suggested by FIGS. 14A . . . 14E. The components may be assembled in any suitable order. As just one example, sub-assembly 1780 may be mounted to printed circuit board 1492B. The conductive elements, such as conductive elements 1782, of sub-assembly 1780 may be attached, such as by soldering to printed circuit board 1492B. Other conductive elements, such as conductive element 1476 may then be attached to printed circuit board 1492B. Printed circuit board 1470B may then be attached once printed circuit board 1492B is inserted in the connector housing.

FIG. 14E shows yet further detail of the components forming connector assembly 1410. In the scenario illustrated in FIG. 14E, the insulative portion of sub-assembly 1780 is not shown to reveal further details of construction. In this view, connections between the conductive elements, such as conductive elements 1782 forming the mating contact portions of the connector, and printed circuit board 1472B are illustrated In this configuration, for example, an end of conductive element 1476 is shown extending upwards for attachment to printed circuit board 1470B and an opposing end is shown extending through printed circuit board 1492B. Other conductive elements along the forward edge may similarly be coupled between printed circuit board 1470B and printed circuit board 1492B. In this way, a conducting path may be provided from a contact tail, such as may extend from a conductive element, such as conductive element 1472, through the isolation circuits within the connector housing to a mating contact portion of a conductive element, such as conductive element 1782. As a result, signals may be coupled through the connector assembly 1410 through an isolation circuit that provides advantageous insertion loss or return loss as described above in connection with FIGS. 12 and 13.

FIG. 15 illustrates yet a further embodiment of a connector. FIG. 15 shows a bottom view of the connector with portions of the housing removed. The connector 1510 may be assembled using techniques as described in connection with FIGS. 14A . . . FIG. 14E. Connector 1510 similarly provides four signal channels. Accordingly, four cores, of which core 1512D is numbered, are shown. Each of the cores may be used to hold windings of transformers used in an isolation circuit. Cores, of which core 1532D is numbered, may hold windings for common mode chokes used in those isolation circuits.

The components of the isolations circuits, and the conductive elements that couple signals to them, may be aligned so as to provide in each channel generally uniform properties. As can be seen, the cores, such as 1532D used to form the common mode chokes and the cores, such as core 1512D used to form the transformers of the isolation circuits, are shown to be aligned. Conductive elements through which signals applied to the aligned transformer and common mode choke in each of the channels are also aligned with those components, which further contributes to all of the signal paths through the connector being substantially the same length and having substantially the same electrical properties. For example, conductive elements $1572_1$ and $1572_2$ are shown to have contact tails suitable for attachment to a printed circuit board, such as printed circuit board 1402 (FIG. 14A). Conductive elements $1572_1$ and $1572_2$ may, in this example, couple a differential signal into a channel including an isolation circuit formed around cores 1512D and 1532D.

The substantially straight path through the connector may be carried through to the mating contact portions. The mating contact portions of conductive elements $1582_1$ and $1582_2$ may be designated for carrying the same signal coupled through to conductive elements $1572_1$ and $1572_2$. Though, it should be recognized that because the signal path includes multiple printed circuit boards, such as printed circuit board 1570 and 1592, any signal path may be coupled to any suitable one of the conductive members forming the mating contact portions at the mating interface by appropriately routing conductive traces within the printed circuit boards connecting the conductive elements within the connector.

Likewise, conductive elements $1572_3$ and $1572_4$ may couple a differential signal into a second channel of the connector. Conductive elements 1572₅ and 1572₆ may couple a differential signal into a third channel. Further, conductive elements 1572₇ and 1572₈ may couple a fourth differential signal into a fourth channel of the connector. In this embodiment, the contact tails along the rear edge of the connector are arranged in a configuration similar to that illustrated in FIG. 6A. This configuration aligns the conductive elements coupling signaling between the connector assembly 1510 and a printed circuit board with the components of the isolation circuit through which those signals will be coupled to mating contact portions of the connector assembly 1510. Though, it should be appreciated that any suitable arrangement of the conductive elements within the connector assembly may be used.

It should also be appreciated that FIG. 15 does not show the wires used to form to windings of the transformer in common mode chokes of the isolation circuits. Such wires may be included, using manufacturing techniques, such as are illustrated in FIGS. 9A . . . 9E, 10 and 11 to form circuits such as are illustrated in FIG. 3 or FIGS. 8A . . . 8D. Those connections may be established in any suitable way, including by directly connecting the wires to the conductive elements or indirectly connecting them through one or more printed circuit boards, such as printed circuit board 1570 or 1592. Additionally, conductive elements, such as posts 1560A . . . 1560D may be included to facilitate connections. For example, each of the post 1560A . . . 1560D may serve as a point of attachment for a center tap of a secondary winding of a transformer of an isolation circuit, such as end 320. Though, it should be appreciated that in embodiments in which a solder bead, such as solder bean 410 is used to shorten the length of the center tap of the transformer, the solder bead or other suitable portion of the center tap may be soldered or otherwise attached to a post 1560A . . . 1560D.

In the embodiments illustrated, some conductive elements are designated as forming a differential pair of conductors and some conductive elements are designated as ground conductors. These designations refer to the intended use of the conductive elements in an interconnection system as they would be understood by one of skill in the art. For example, though other uses of the conductive elements may be possible, differential pairs may be identified based on preferential coupling between the conductive elements that make up the pair. Electrical characteristics of the pair, such as its impedance, that make it suitable for carrying a differential signal may provide an alternative or additional method of identifying a differential pair. For example, a pair of signal conductors may have a differential mode impedance of between 75 Ohms and 100 Ohms. As a specific example, a signal pair may have an impedance of 85 Ohms +/− 10%.

Also, it should be appreciated that a "ground" for a high speed signal need not refer to earth ground. The ground may be any constant or relatively slowly varying signal that may serve as a reference potential for the high speed signal. For example, a conductive element designated as a "ground" may be connected to a DC power supply of any suitable voltage. Accordingly, all of the conductive elements designated as "grounds" need not be connected together such that different ground conductors may be at different voltages. Moreover, though some conductive elements in a connector may be suitable for connection to ground, it is not a requirement that they be connected to ground in use in order to be termed "ground" conductors. In some embodiments, "ground" conductors may carry signals that are relatively slowly varying or change infrequently relative to the frequency components of a high speed signal.

As another example, certain features of connectors were described relative to a "forward" edge. In a right angle connector, the forward direction may be regarded as surfaces of the connector facing in the direction from which a mating connector is inserted. However, it should be recognized that terms such as "forward" or "front" and "rear" are intended to differentiate surfaces from one another and may have different meanings in electronic assemblies in different forms. Likewise, terms such as "upper" and "lower" are intended to differentiate features based on their relative position to a printed circuit board or to portions of a connector adapted for attachment to a printed circuit board. Such terms as "upper" and "lower" do not imply an absolute orientation relative to an inertial reference system or other fixed frame of reference.

Further, certain components are described to be connected and may be illustrated as directly connected. A connection may be created through any physical connection such that the existence of intermediate components does not preclude components from being connected.

Accordingly, the invention should be limited only by the attached claims.

What is claimed is:

1. An electronic assembly comprising:
   a jack comprising a plurality of conductive elements, the plurality of conductive elements being arranged in a plurality of pairs;
   a plurality of transformers, each of the plurality of transformers being associated with a respective pair of the plurality of pairs, each of the transformers comprising:
      a first winding comprising at least two wires wound in parallel, the at least two wires of the first winding each having a first end and a second end, the first end being electrically coupled to a first conductive element of the respective pair and the second end being electrically coupled to a second conductive element of the respective pair; and
      and a second winding comprising at least two wires wound in parallel.

2. The electronic assembly of claim 1, wherein for each of the plurality of transformers, a wire of the at least two wires of the first winding of the transformer comprises a portion extending from the transformer as a center tap of the first winding.

3. The electronic assembly of claim 2, wherein for each of the plurality of transformers, a wire of the at least two wires of the second winding of the transformer comprises a portion extending from the transformer as a center tap of the second winding.

4. The electronic assembly of claim 3, wherein:
   the electronic assembly further comprises a plurality of chokes, each choke being electrically coupled to a transformer of the plurality of transformers;
   the jack comprises a housing and the housing encloses the plurality of transformers and the plurality of chokes; and
   the housing comprises a wall separating the plurality of transformers from the plurality of chokes.

5. The electronic assembly of claim 1, wherein:
   each of the plurality of transformers comprises a core; and
   for each of the plurality of transformers, the primary winding and the secondary winding of the transformer are wound around the core.

6. The electronic assembly of claim 5, wherein for each of the plurality of transformers, the first winding is wound six or fewer turns around the core.

7. The electronic assembly of claim 6, wherein for each of the plurality of transformers, each of the at least two wires of the first winding is twisted together with a wire of the at least two wires of the second winding.

8. The electronic assembly of claim 1, wherein for each of the plurality of transformers:
the transformer comprises a first center tap in the first winding and a second center tap in the second winding, the first center tap and the second center tap each being coupled to a conductive element of the plurality of conductive elements.

9. The electronic assembly of claim 8, wherein:
the plurality of conductive elements are disposed in two parallel columns of conductive elements; and
for each of the plurality of transformers, the first end, the second end and the center tap of the first winding are coupled to a set of three conductive elements of the plurality of conductive elements, the set of three conductive elements comprising two conductive elements in a first of the two parallel columns and a conductive element in a second of the two parallel columns.

10. The electronic assembly of claim 1, wherein:
the assembly further comprises a printed circuit board;
the jack is mounted to the printed circuit board; and
the plurality of transformers are attached to the printed circuit board and connected to the conductive elements of the jack through the printed circuit board.

11. An electronic assembly comprising:
a connector comprising a plurality of conductive elements;
a plurality of circuits, each circuit being coupled to a respective set of conductive elements of the plurality of conductive elements, and each of the plurality of circuits comprising:
a transformer comprising a plurality of primary windings and a plurality of secondary windings; and
a choke connected in series with the transformer.

12. The electronic assembly of claim 11, wherein:
for each of the plurality of circuits, the transformer comprises:
a core;
at least one wire wrapped around the core, the wire comprising a primary winding of the plurality of primary windings, and the wire comprising a twisted portion, the twisted portion comprising a center tap of the primary winding; and
a solder bead on the twisted portion adjacent the core.

13. The electronic assembly of claim 11, wherein:
the connector comprises an RJ-45 jack;
the jack comprises a housing; and
the plurality of circuits are disposed within the housing.

14. The electronic assembly of claim 13, wherein:
the housing comprises an insulative portion having a surface configured for attachment to a printed circuit board;
the surface has at least one cavity formed therein; and
the plurality of circuits are disposed in the at least one cavity.

15. The electronic assembly of claim 14, wherein:
the transformers of the plurality of circuits are aligned in parallel, forming a column of center-tapped transformers across a first cavity of the at least one cavity.

16. The electronic assembly of claim 15, wherein:
the chokes of the plurality of circuits are aligned in parallel across a second cavity of the at least one cavity.

17. The electronic assembly of claim 16, wherein:
the first cavity and the second cavity are separated by a wall;
the wall comprising a plurality of conductive elements attached thereto; and the secondary winding of the transformer of each of the plurality of circuits has a secondary center-tap extending therefrom;
the secondary center-tap of each of the plurality of circuits is connected to a conductive element of the plurality of conductive elements attached to the wall.

18. The electronic assembly of claim 15, wherein:
the column of transformers has a first end and a second end; and
the housing of the connector has a relieved portion adjacent the first end and the second end of the column of transformers.

19. The electronic assembly of claim 12, wherein:
the plurality of circuits are arranged within the housing such that the transformer and the choke of each of the plurality of circuits are disposed along a line, and the lines for the plurality of circuits are parallel.

20. The electronic assembly of claim 11, wherein:
the electronic assembly further comprises a plurality of conductive elements disposed in two parallel columns;
each of the plurality of circuit comprises a plurality of wire ends extending therefrom and connected to a respective set of the plurality of conductive elements; and
for each of the plurality of circuits, the respective set comprises two conductive elements in a first of the two parallel columns and a conductive element in a second of the two parallel columns.

21. The electronic assembly of claim 18, further comprising:
a printed circuit board;
a 10 G Ethernet transceiver comprising a plurality of signal terminals, the plurality of signal terminals being coupled to the plurality of conductive elements of the connector through the plurality of circuits.

22. A method of operating an electronic assembly, the method comprising:
generating a plurality of 10 G Ethernet signals;
coupling each of the plurality of 10 G Ethernet signals to a conductive element of a connector comprising a plurality of conductive elements, each of the 10 G Ethernet signals being coupled through a circuit of a plurality of circuits,
wherein each of the plurality of circuits comprises:
a transformer comprising a plurality of primary windings and a plurality of secondary windings; and
a choke connected in series with the transformer.

23. The method of claim 22, wherein:
the plurality of 10 G Ethernet signals comprise differential signals in a frequency range of 100 MHz to 1000 MHz.

24. The method of claim 22, wherein:
coupling each of the plurality of 10G Ethernet signals to a conductive element comprises coupling the signal with an insertion loss of less than −2 dB over the frequency range of 100 MHz to 1000 MHz.

25. The method of claim 22, wherein:
coupling each of the plurality of 10 G Ethernet signals to a conductive element comprises coupling the signal with a return loss of less than −10 dB over the frequency range of 100 MHz to 1000 MHz.

26. An electronic assembly comprising:
a connector comprising a plurality of conductive elements, the plurality of conductive elements being arranged in a plurality of pairs;
a plurality of transformers, each of the plurality of transformers being associated with a respective pair of the plurality of pairs, each of the transformers comprising:
a core;

a first winding around the core, the first winding comprising at least two wires wound in parallel, the at least two wires of the first winding each having a first end and a second end, the first end being electrically coupled to a first conductive element of the respective pair and the second end being electrically coupled to a second conductive element of the respective pair; and and a second winding around the core, the second winding comprising at least two wires wound in parallel, wherein a first of the at least two wires of the first winding is twisted together with a first of the at least two wires of the second winding.

27. The electronic assembly of claim 26, wherein:
a second of the at least two wires of the first winding is twisted together with a second of the at least two wires of the second winding.

28. The electronic assembly of claim 27, wherein each of the conductive elements comprises a tail configured for attachment to a printed circuit board; and the electronic assembly further comprises a plurality of chokes, each choke electrically coupling the first winding of a respective transformer of the plurality of transformers to the respective pair of the plurality of pairs.

29. The electronic assembly of claim 28, wherein:
the connector comprises an insulative housing and the plurality of transformers and the plurality of chokes are supported within the housing.

30. The electronic assembly of claim 29, wherein
the connector further comprises a plurality of posts support by the housing between the plurality of transformers and the plurality of chokes;
the second winding of each of the transformers comprises a center tap, the center tap being electrically connected to a respective post of the plurality of posts.

31. The electronic assembly of claim 30, wherein the housing comprises a wall separating the plurality of transformers from the plurality of chokes and the plurality of posts are mounted in the wall.

* * * * *